United States Patent
Nakagawa et al.

(10) Patent No.: US 10,777,726 B2
(45) Date of Patent: Sep. 15, 2020

(54) THERMOELECTRIC CONVERSION MODULE, SENSOR MODULE, AND INFORMATION PROCESSING SYSTEM

(71) Applicant: FUJITSU LIMITED, Kawasaki-shi, Kanagawa (JP)

(72) Inventors: Kanae Nakagawa, Sagamihara (JP); Takashi Suzuki, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/250,193

(22) Filed: Jan. 17, 2019

(65) Prior Publication Data
US 2019/0148616 A1    May 16, 2019

Related U.S. Application Data

(60) Provisional application No. PCT/JP2016/071561, filed on Jul. 22, 2016.

(51) Int. Cl.
*H01L 35/30* (2006.01)
*H01L 31/054* (2014.01)
(Continued)

(52) U.S. Cl.
CPC ............... *H01L 35/30* (2013.01); *B65F 3/00* (2013.01); *F28D 20/02* (2013.01); *F28D 20/021* (2013.01); *F28F 3/02* (2013.01); *F28F 21/081* (2013.01); *G08G 1/01* (2013.01); *H01L 31/0547* (2014.12); *H01L 35/32* (2013.01); *H02N 11/00* (2013.01);
(Continued)

(58) Field of Classification Search
CPC ......... F28F 21/081; F28F 3/02; F28D 20/026; F28D 20/021; G08G 1/01; H04Q 9/00; B65F 3/00; H01L 35/02–34
See application file for complete search history.

(56) References Cited

U.S. PATENT DOCUMENTS 5,315,154 A    5/1994 Elwell
2005/0007740 A1    1/2005 Neuschuetz et al.
(Continued)

FOREIGN PATENT DOCUMENTS

DE    10157671    6/2003
EP    2475019    7/2012
(Continued)

OTHER PUBLICATIONS

EESR—Extended European Search Report of European Patent Application No. 16909548.6 dated Jun. 25, 2019.
(Continued)

*Primary Examiner* — Golam Mowla
(74) *Attorney, Agent, or Firm* — Fujitsu Patent Center

(57) ABSTRACT

A thermoelectric conversion module includes a thermoelectric conversion element, a container, a heat storage material accommodated in the container, and a first heat transfer member thermally coupled to one side of the thermoelectric conversion element and thermally coupled to the heat storage material, wherein the first heat transfer member includes a portion made of a solid-solid phase transition system heat storage material having a thermal conductivity higher than a thermal conductivity of the heat storage material and having a transition temperature different from a transition temperature of the heat storage material.

13 Claims, 20 Drawing Sheets

(51) Int. Cl.
*H01L 35/32* (2006.01)
*H02N 11/00* (2006.01)
*F28D 20/02* (2006.01)
*F28F 3/02* (2006.01)
*H04Q 9/00* (2006.01)
*B65F 3/00* (2006.01)
*F28F 21/08* (2006.01)
*G08G 1/01* (2006.01)
*G01D 21/00* (2006.01)

(52) U.S. Cl.
CPC .............. *H04Q 9/00* (2013.01); *F28D 20/026* (2013.01); *F28F 2215/00* (2013.01); *G01D 21/00* (2013.01); *Y02E 60/145* (2013.01)

(56) References Cited

U.S. PATENT DOCUMENTS

| | | | |
|---|---|---|---|
| 2011/0056650 A1* | 3/2011 | Ito | H01L 23/4275 165/67 |
| 2012/0305045 A1* | 12/2012 | Kamping | H01L 35/00 136/205 |
| 2013/0285233 A1 | 10/2013 | Bao et al. | |
| 2014/0216027 A1 | 8/2014 | Iida et al. | |
| 2014/0338713 A1 | 11/2014 | Nakanuma | |
| 2015/0033764 A1 | 2/2015 | Gurevich et al. | |
| 2016/0169591 A1 | 6/2016 | Thiagarajan et al. | |
| 2017/0210204 A1* | 7/2017 | Fuse | B60W 10/30 |

FOREIGN PATENT DOCUMENTS

| | | |
|---|---|---|
| JP | 2013-175620 | 9/2013 |
| JP | 2016-040811 | 3/2016 |
| JP | 2016-80315 | 5/2016 |
| WO | 2012/133790 | 10/2012 |
| WO | 2013/099943 | 7/2013 |

OTHER PUBLICATIONS

International Search Report and Written Opinion of the International Searching Authority, mailed in connection with PCT/JP2016/071561, dated Aug. 16, 2016 (9 pages), with partial English translation.

* cited by examiner

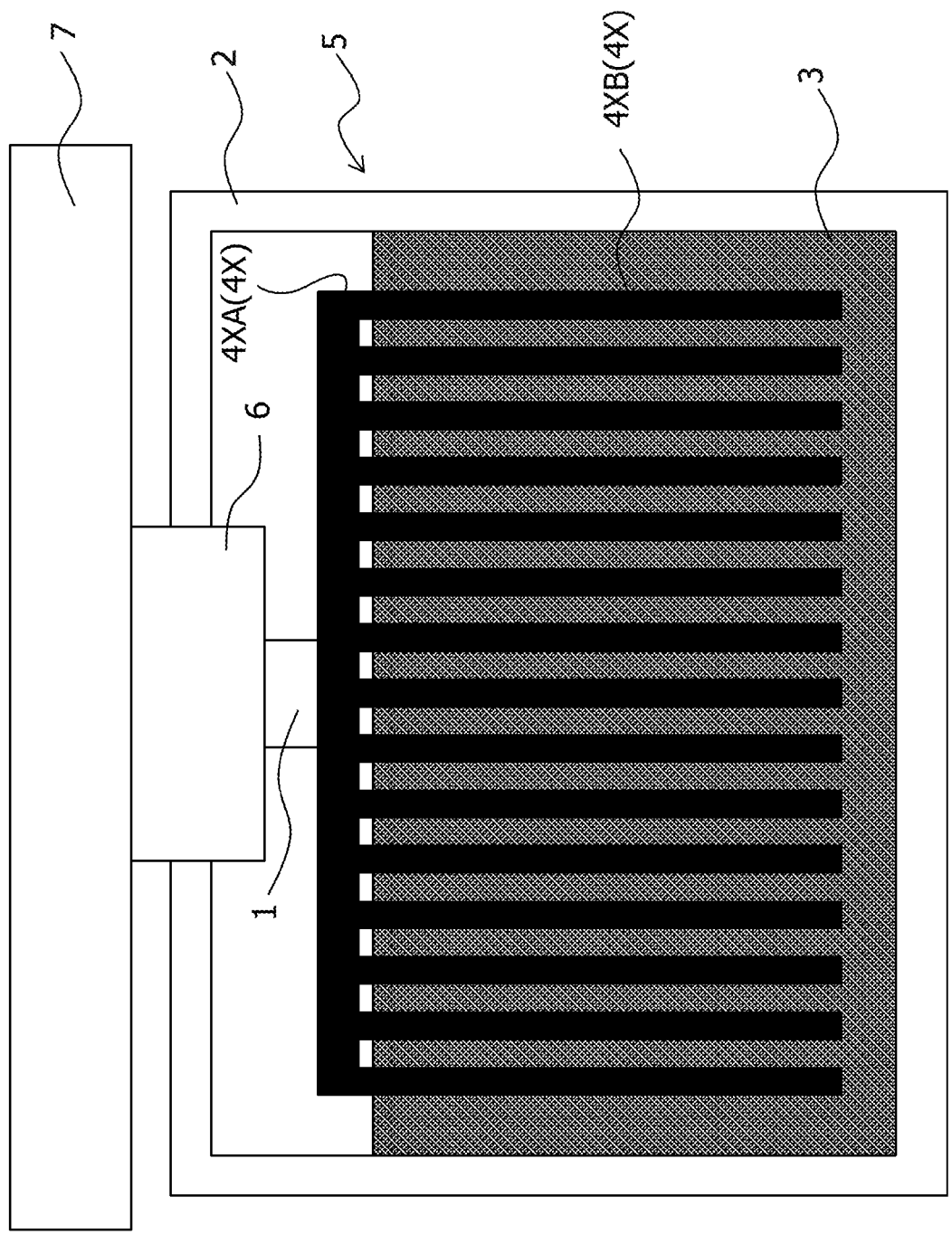

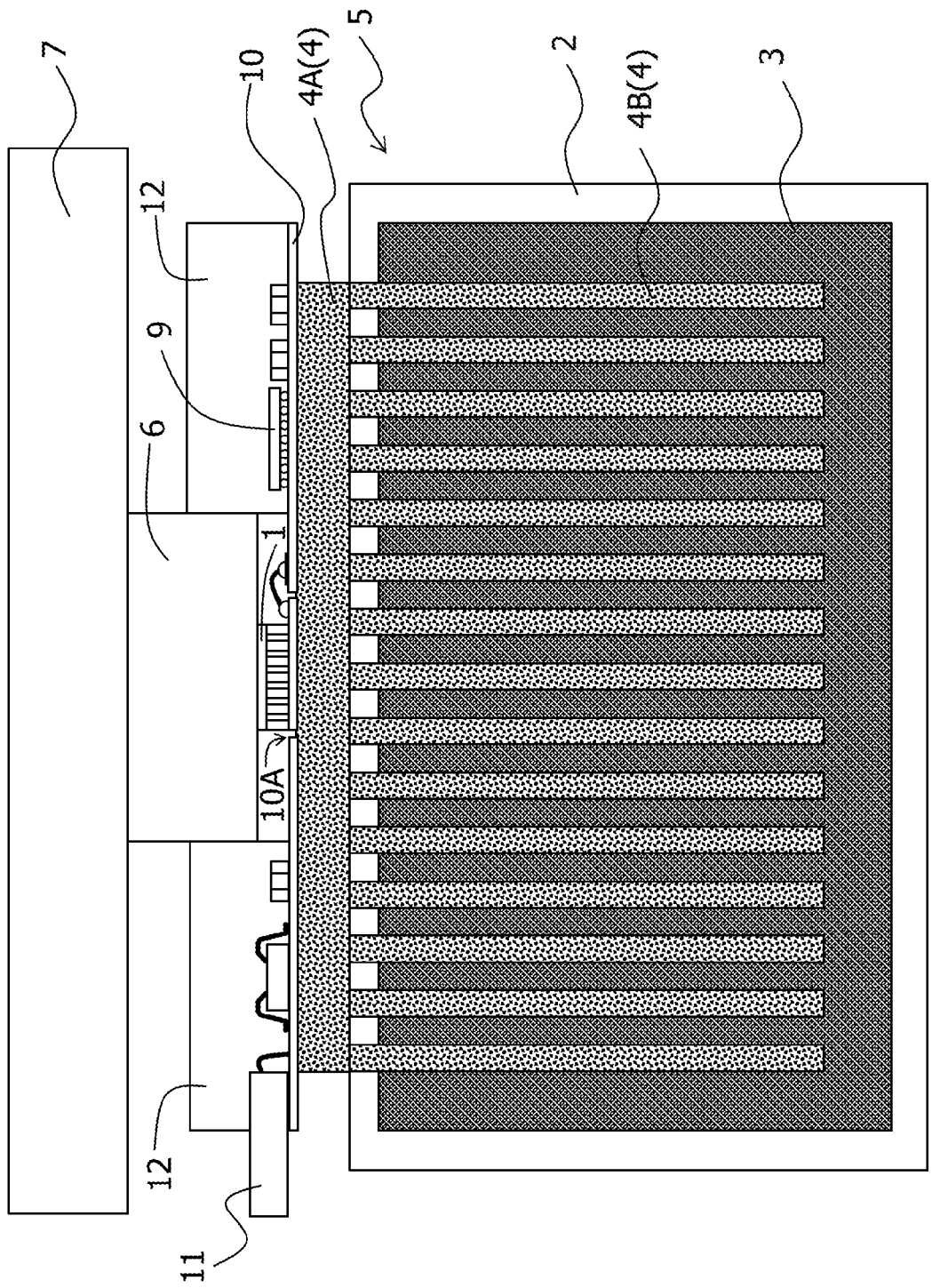

THERMOELECTRIC CONVERSION MODULE, SENSOR MODULE, AND INFORMATION PROCESSING SYSTEM

CROSS-REFERENCE TO RELATED APPLICATION

This application is a continuation application of International Application PCT/JP2016/071561 filed on Jul. 22, 2016 and designated the U.S., the entire contents of which are incorporated herein by reference.

FIELD

The embodiments discussed herein are related to a thermoelectric conversion module, a sensor module, and an information processing system.

BACKGROUND

For example, it is promising to use environmental power generation in which a power line and a signal line that poses problems in construction of a sensor network are unnecessary. As the environmental power generation, power generation using a thermoelectric conversion element that generates electricity due to a temperature difference is effective in addition to solar power generation.

For example, there is a technology that causes a temperature difference in a thermoelectric conversion element by using a change over time in the temperature of a heat source. In this case, the heat source is brought into contact with one side of the thermoelectric conversion element, and a heat storage material is brought into contact with the other side. In addition, as the temperature of the heat source changes over time, a temperature difference is generated between the heat source and the heat storage material, and the thermoelectric conversion element generates electricity in accordance with the temperature difference.

In addition, for example, there is a technology that uses two or more heat storage materials having different operating temperatures to increase the amount of power generation.

When two or more heat storage materials having different operating temperatures are used to increase the amount of power generation, it is conceivable to place the two or more heat storage materials in different containers such that heat is transferred to the heat storage materials through the respective containers.

The followings are reference documents.
[Document 1] International Publication Pamphlet No. WO2012/133790 and
[Document 2] International Publication Pamphlet No. WO2013/099943

SUMMARY

According to an aspect of the invention, a thermoelectric conversion module includes a thermoelectric conversion element, a container, a heat storage material accommodated in the container, and a first heat transfer member thermally coupled to one side of the thermoelectric conversion element and thermally coupled to the heat storage material, wherein the first heat transfer member includes a portion made of a solid-solid phase transition system heat storage material having a thermal conductivity higher than a thermal conductivity of the heat storage material and having a transition temperature different from a transition temperature of the heat storage material.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 9 is a schematic cross-sectional view illustrating a configuration of a thermoelectric conversion module using a metal heat sink;

FIG. 10 is a schematic cross-sectional view illustrating a configuration of a modification of the thermoelectric conversion module according to the first embodiment;

DESCRIPTION OF EMBODIMENTS

A thermoelectric conversion module, a sensor module, and an information processing system according to embodiments of the technology discussed herein are described below with reference to the drawings.

First Embodiment

First, a thermoelectric conversion module according to an embodiment is described with reference to FIGS. 1 to 12.

The thermoelectric conversion module according to the embodiment is used for power generation using a thermoelectric conversion element that generates electricity due to a temperature difference in environmental power generation.

Figure 1:
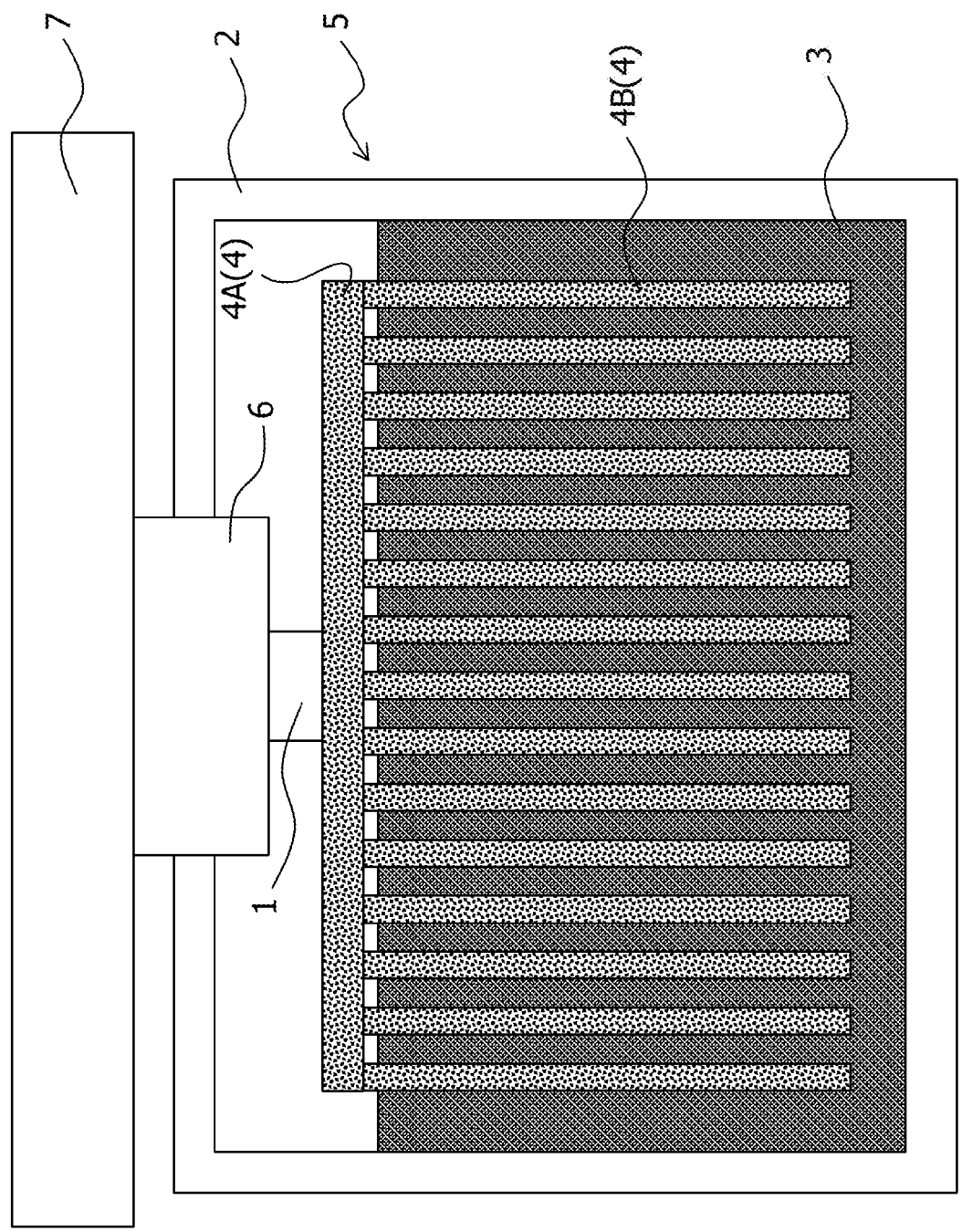
FIG. 1 is a schematic cross-sectional view illustrating a configuration of a thermoelectric conversion module according to a first embodiment.

The thermoelectric conversion module according to the embodiment causes a temperature difference between both ends of the thermoelectric conversion element by using a heat storage material and includes a thermoelectric conversion element 1, a container 2, a heat storage material 3, and a first heat transfer member 4 as illustrated in FIG. 1.

The thermoelectric conversion element 1 is also referred to as a thermoelectric conversion device, a thermoelectric element, or a thermoelectric device. In addition, a thermoelectric conversion module 5 is also referred to as a thermoelectric module, a thermoelectric power generation module, a latent heat usage thermoelectric power generation module, a power source module, a thermoelectric conversion apparatus, or a thermoelectric power generation apparatus. In addition, the first heat transfer member 4 is also referred to as a heat sink.

Here, the thermoelectric conversion element 1 has, for example, a structure in which a p-type thermoelectric material and an n-type thermoelectric material are alternately arranged and coupled between two substrates on which wiring is formed. In addition, the thermoelectric conversion element 1 is disposed such that one side of the thermoelectric conversion element 1 becomes the heat dissipation side and the other side of the thermoelectric conversion element 1 becomes the heat source side. That is, the first heat transfer member 4 is thermally coupled to the one side of the thermoelectric conversion element 1, and a heat source 7 is thermally coupled to the other side.

The container 2 is, for example, a heat insulation container made of a heat insulation member such as a resin (for example, a resin container). Thus, the heat storage material 3 accommodated in the container 2 is insulated from the outside. As a result, the latent heat of the heat storage material 3 is used efficiently. The heat insulation container is a container having a high thermal resistance.

The heat storage material 3 is accommodated in the container 2. Here, the heat storage material 3 is a latent heat storage material, and for example, an inorganic hydrated salt such as sodium sulfate hydrate or sodium acetate hydrate, water, an organic compound such as paraffin, or the like may be used. Such a latent heat storage material is also referred to as a liquid-solid phase transition system heat storage material. The liquid-solid phase transition system heat storage material is also referred to as a liquid-solid phase transition system latent heat storage material.

Here, the water has the transition temperature (melting point) of 0° C., the melting latent heat of 336 kJ/kg, the thermal conductivity of 2.2/0.6 (−10° C./20° C.) W/mK, and the density of 1.0/0.917 (−10° C./20° C.) g/cm$^3$.

Sodium sulfate decahydrate as the sodium sulfate hydrate has the transition temperature (melting point) of 32.4° C., a melting latent heat of 251 kJ/kg, a thermal conductivity of 0.19/0.22 (12° C./37° C.) W/mK, and a density of 1.39/1.41 (10° C./40° C.) g/cm$^3$.

Sodium acetate trihydrate as the sodium acetate hydrate has the transition temperature (melting point) of 55 to 58° C., the melting latent heat of 241/264 kJ/kg, the thermal conductivity of 0.18/0.34 (32° C./49° C.) W/mK, and the density of 1.39/1.35 (25° C./47° C.) g/cm$^3$.

The paraffin has the transition temperature (melting point) of −30° C. to 45° C., the melting latent heat of 150 to 250 kJ/kg, the thermal conductivity of 0.18/0.15 (solid phase/liquid phase) W/mK, and the density of 0.787/0.765 (solid phase/liquid phase) g/cm$^3$.

The first heat transfer member 4 is thermally coupled to the one side of the thermoelectric conversion element 1 and is thermally coupled to the heat storage material 3. Here, the first heat transfer member 4 has a thermal conductivity higher than that of the container 2. In this case, heat is transferred to the heat storage material 3 from the heat source through the thermoelectric conversion element 1 and the first heat transfer member 4.

In addition, the first heat transfer member 4 includes a portion that is made of a solid-solid phase transition system heat storage material having a thermal conductivity higher than that of the heat storage material 3 and having a transition temperature different from that of the heat storage material 3. The solid-solid phase transition system heat storage material is a latent heat storage material and also referred to as a solid-solid phase transition system latent heat storage material.

Here, the solid-solid phase transition system heat storage material having a thermal conductivity higher than that of the heat storage material 3 and having a transition temperature different from that of the heat storage material 3 is a solid-solid phase transition system heat storage material including a metal (in particular, a transition metal) as one of components.

Such a solid-solid phase transition system heat storage material includes, for example, a vanadium oxide (for example, $VO_2$ compound), $BaTiO_3$, and Fe—Co.

Here, the vanadium oxide has the transition temperature of −100 to 200° C. (for example, 10° C., 20° C., 30° C., 40° C., or the like), the latent heat of 30 to 60 kJ/kg, the thermal conductivity of 5 W/mK, and the density of 4.3 g/cm$^3$.

$BaTiO_3$ has the transition temperature of 130° C., the thermal conductivity of 6 W/mK, and the density of 6.02 g/cm$^3$.

Fe—Co has the transition temperature of 700 to 1000° C., the thermal conductivity of 10 W/mK, and the density of 8 g/cm$^3$.

As described above, to increase the amount of the power generation, two types of heat storage materials having different transition temperatures (operation temperatures) are used, and a solid-solid phase transition system heat storage material is used as one of these heat storage materials. In addition, the solid-solid phase transition system heat storage material may function as a heat transfer member that has a thermal conductivity higher than that of the heat storage material 3. Therefore, it is assumed that the heat storage material 3 is accommodated in the container 2, and the first heat transfer member 4 is used to transfer the heat from the heat source 7 to the heat storage material 3 through the thermoelectric conversion element 1, and the first heat transfer member 4 includes a portion made of the solid-solid phase transition system heat storage material. In this case, the solid-solid phase transition system heat storage material functions as a heat storage material and also functions as a heat transfer member. As a result, the thermoelectric conversion module increases the amount of power generation without causing an increase in the size.

In the embodiment, the first heat transfer member 4 includes a base part 4A thermally coupled to the one side of the thermoelectric conversion element 1 and fins 4B thermally coupled to the heat storage material 3, and each of the base part 4A and the fin 4B is made of a solid-solid phase transition system heat storage material. In this case, the whole first heat transfer member 4 is made of the solid-solid phase transition system heat storage material. That is, the first heat transfer member 4 is an integrally-molded body formed by integrating the base part 4A and the fins 4B made of the solid-solid phase transition system heat storage material. The fin 4B is also referred to as a heat dissipation fin or a heat radiator. In addition, it is assumed that the fin 4B includes a pin.

Here, the fin 4B is disposed so as to protrude from the surface of the base part 4A, and the whole fin 4B and the whole base part 4A are accommodated in the container 2. In addition, the base part 4A is not in contact with the heat storage material 3 and the fin 4B is immersed in and thermally coupled to the heat storage material 3. As described above, at least a part of the fin 4B included in the first heat transfer member 4 thermally coupled to the thermoelectric conversion element 1 is immersed in the heat storage material 3.

As described above, the first heat transfer member 4 is immersed in the heat storage material 3 and includes the fin 4B that extends in the direction away from the thermoelectric conversion element 1. With this configuration, the fin 4B included in the first heat transfer member 4 in contact with the thermoelectric conversion element 1 is inserted into the heat storage material 3, and therefore, the efficiency of heat conduction to the heat storage material 3 may be improved.

Here, the base part 4A and the heat storage material 3 are spaced apart from each other so as not to be in contact with each other. This is because the base 4A stores more heat since the base part 4A is closest to the heat source 7 and has a large volume, and, if the base part 4A is in contact with the heat storage material 3, first, melting is started from the heat storage material 3 in contact with the base part 4A, and then the sensible heat appears to increase the temperature of the heat storage material 3. The embodiment is not limited to such a case, and for example, a resin plate as a heat insulation member may be inserted between the base part 4A and the heat storage material 3 (for example, see FIG. 10).

Figure 2:
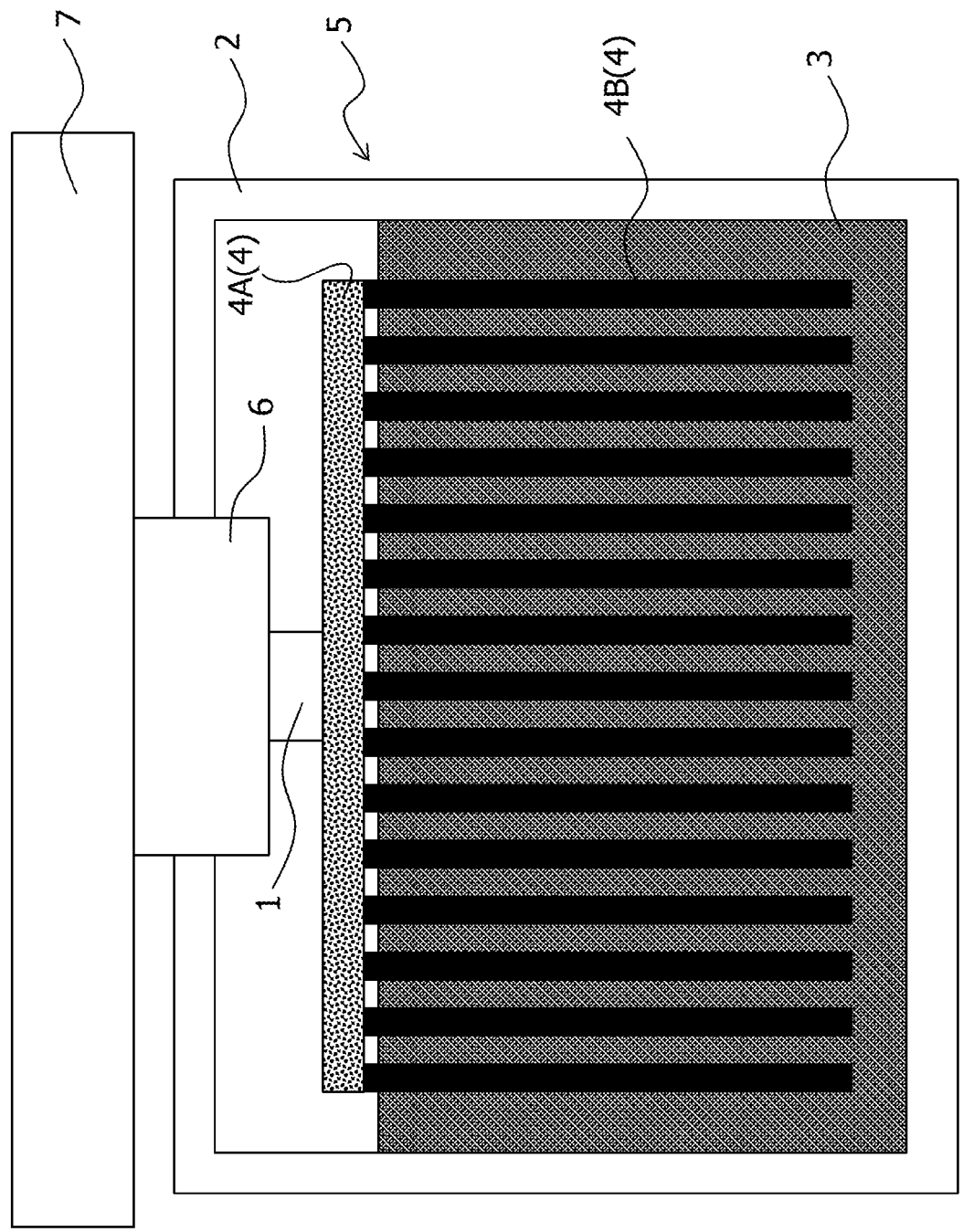
FIG. 2 is a schematic cross-sectional view illustrating a configuration of a modification of the thermoelectric conversion module according to the first embodiment.

The embodiment is not limited to such a case, and, for example, as illustrated in FIG. 2, it may be assumed that the first heat transfer member 4 includes the base part 4A thermally coupled to the one side of the thermoelectric conversion element 1 and the fin 4B thermally coupled to the heat storage material 3, the base part 4A is made of a solid-solid phase transition system heat storage material, and the fin 4B is made of a material different from the solid-solid phase transition system heat storage material. In this case, for example, it is sufficient that the fin 4B is made of a high thermal conductivity material such as a metal, for example, aluminum.

Figure 3:
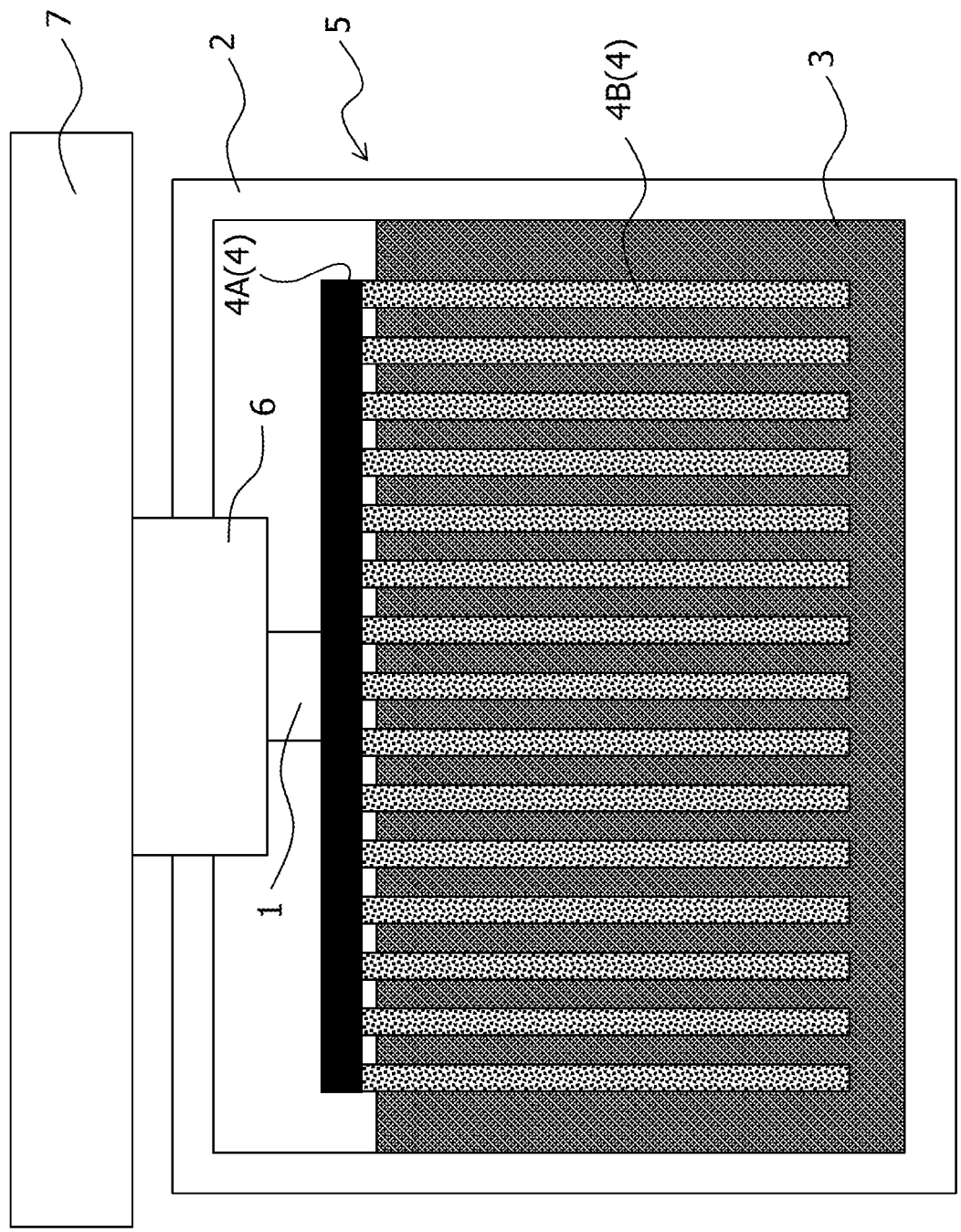
FIG. 3 is a schematic cross-sectional view illustrating a configuration of a modification of the thermoelectric conversion module according to the first embodiment.

In addition, for example, as illustrated in FIG. 3, it may be assumed that the first heat transfer member 4 includes the base part 4A thermally coupled to the one side of the thermoelectric conversion element 1 and the fin 4B thermally coupled to the heat storage material 3, the fin 4B is made of a solid-solid phase transition system heat storage material, and the base part 4A is made of a material different from the solid-solid phase transition system heat storage material. In this case, for example, it is sufficient that the base part 4A is made of a high thermal conductivity material such as a metal, for example, aluminum.

Figure 4:
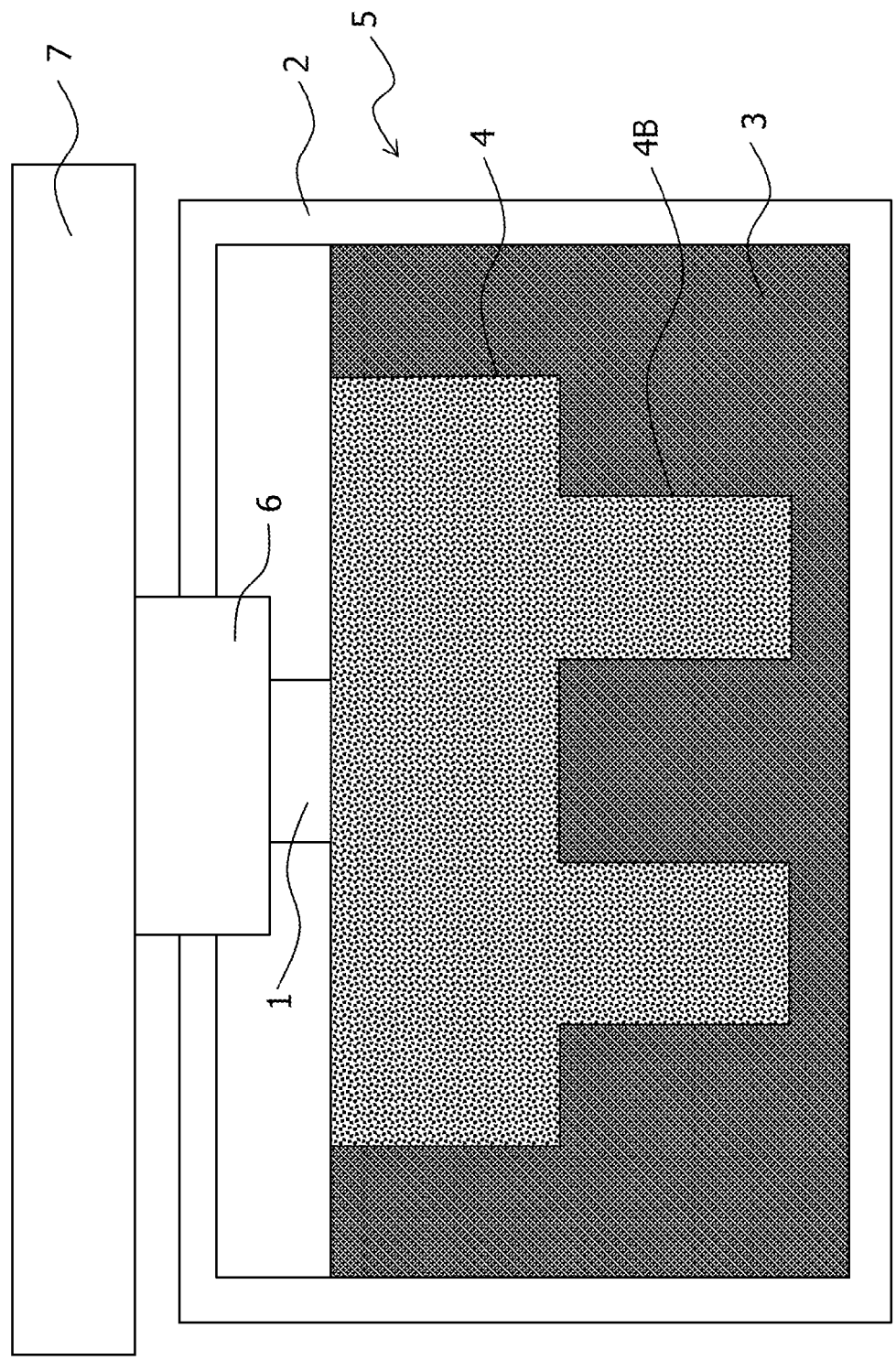
FIG. 4 is a schematic cross-sectional view illustrating a configuration of a modification of the thermoelectric conversion module according to the first embodiment.

In addition, for example, as illustrated in FIG. 4, it may be assumed that the whole first heat transfer member 4 is made of a solid-solid phase transition system heat storage material, is immersed in the heat storage material 3, and directly coupled to the heat storage material 3, and thus the first heat transfer member 4 is thermally coupled to the heat storage material 3. In this case, the first heat transfer member 4 may be formed so as to be integrated with the fin 4B or may not include the fin 4B.

Figure 5:
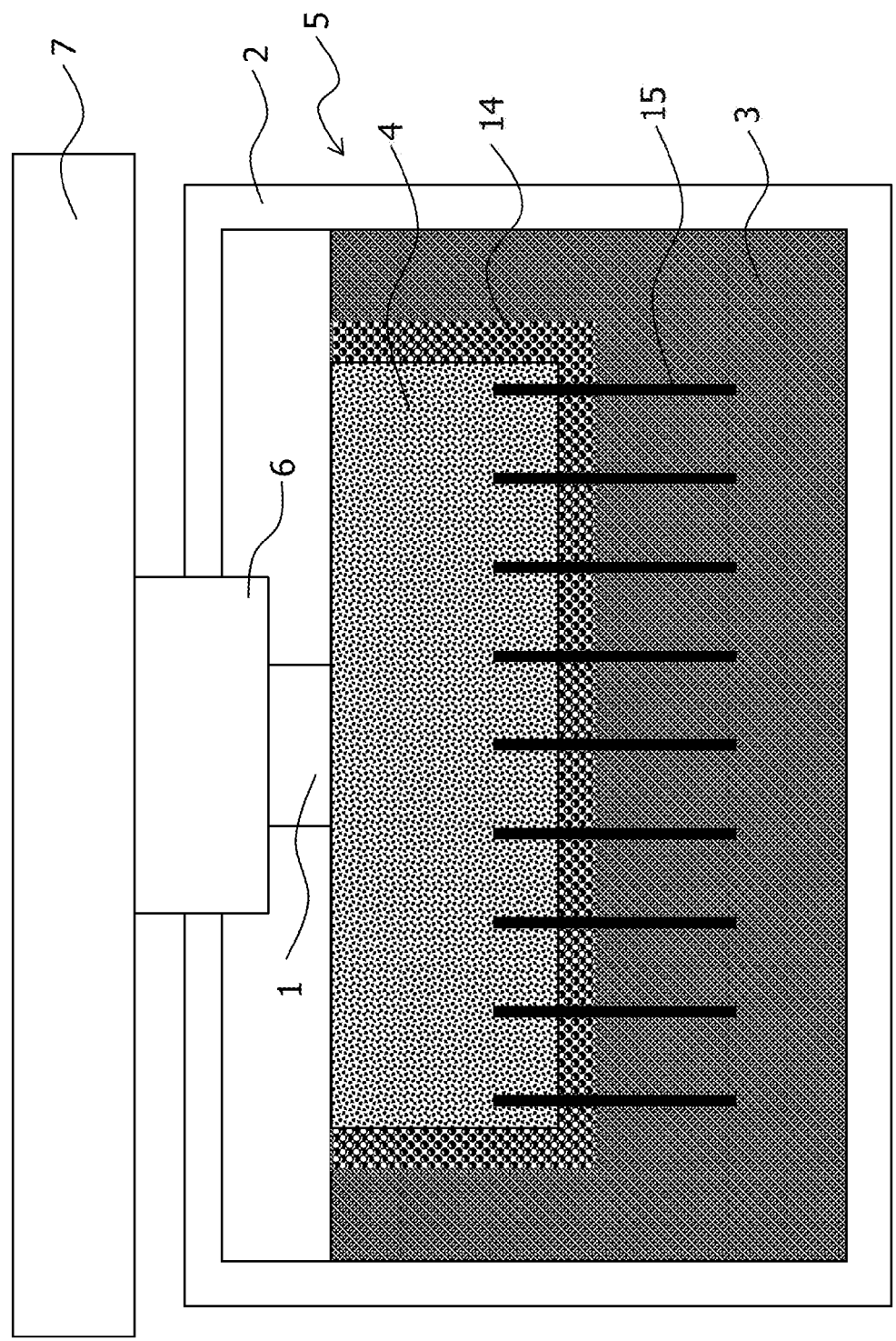
FIG. 5 is a schematic cross-sectional view illustrating a configuration of a modification of the thermoelectric conversion module according to the first embodiment.

In addition, for example, as illustrated in FIG. 5, it may be assumed that the whole first heat transfer member 4 is made of a solid-solid phase transition system heat storage material, a heat insulation member (for example, resin member) 14 is disposed between the heat storage material 3 and the first heat transfer member 4, and a fin 15 is disposed so as to penetrate the heat insulation member 14, thermally couple the heat storage material 3 and the first heat transfer member 4, and is made of a material different from the solid-solid phase transition system heat storage material. In this case, it is sufficiently that the fin 15 is, for example, made of a high thermal conductivity material such as a metal, for example, aluminum. The heat insulation member 14 may not be disposed in the thermoelectric conversion module. However, when the heat insulation member 14 is disposed in the thermoelectric conversion module, it may be suppressed that the melting starts from a portion of the heat storage material 3, which is directly in contact with the first heat transfer member 4, and then the sensible heat appears to increase the temperature of the heat storage material 3.

In the embodiment, in addition, a second heat transfer member 6 that has a thermal conductivity higher than that of the container 2 may be accommodated in the container 2. The second heat transfer member 6 is, for example, made of a high thermal conductivity material such as a metal. In addition, the thermoelectric conversion element 1 is accommodated in the container 2, and the other side of the thermoelectric conversion element 1, that is, a side opposite to the side thermally coupled to the first heat transfer member 4, is thermally coupled to the second heat transfer member 6. The second heat transfer member 6 is also referred to as a heat transfer component.

Here, the second heat transfer member 6 is disposed in an opening of the container 2, and the second heat transfer member 6 is thermally coupled to the external heat source 7, and the heat from the heat source 7 outside the container is transferred to the thermoelectric conversion element 1 through the second heat transfer member 6, and then transferred to the first heat transfer member 4 through the thermoelectric conversion element 1, and therefore, the heat is transferred from the first heat transfer member 4 to the heat storage material 3.

Figure 6:
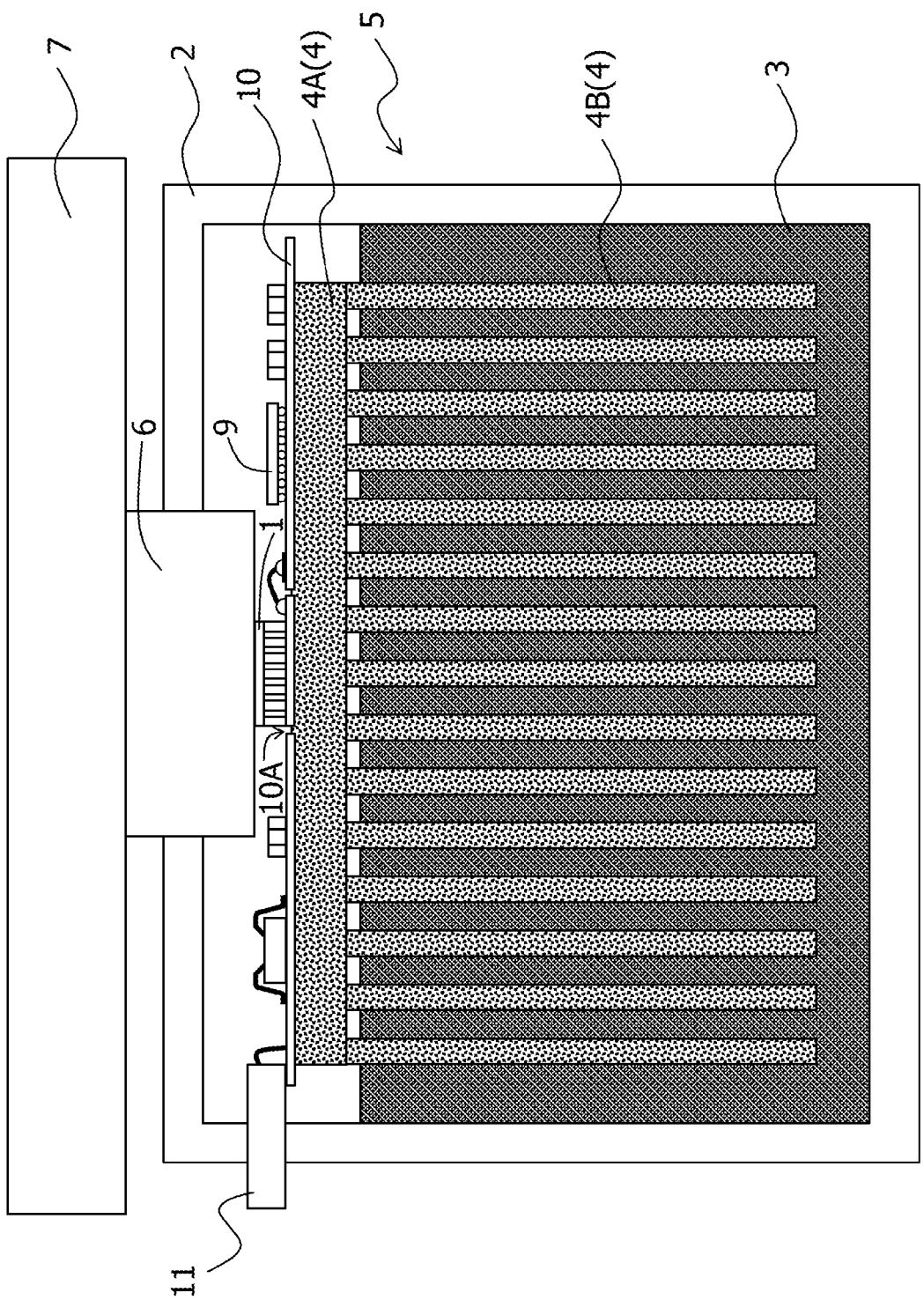
FIG. 6 is a schematic cross-sectional view illustrating a configuration of the thermoelectric conversion module according to the first embodiment.

More specifically, in the embodiment, as illustrated in FIG. 6, a substrate 10 includes an opening 10A and on which an electronic component 9 is mounted. In addition, the thermoelectric conversion element 1 is disposed in the opening 10A of the substrate 10 and is electrically coupled to the substrate 10. In addition, the substrate 10 is coupled to an external connection terminal 11. The substrate 10 is also referred to as a circuit board.

A case in which a liquid-solid phase transition system heat storage material is used as the heat storage material 3 is described below in detail as an example.

Figure 7:
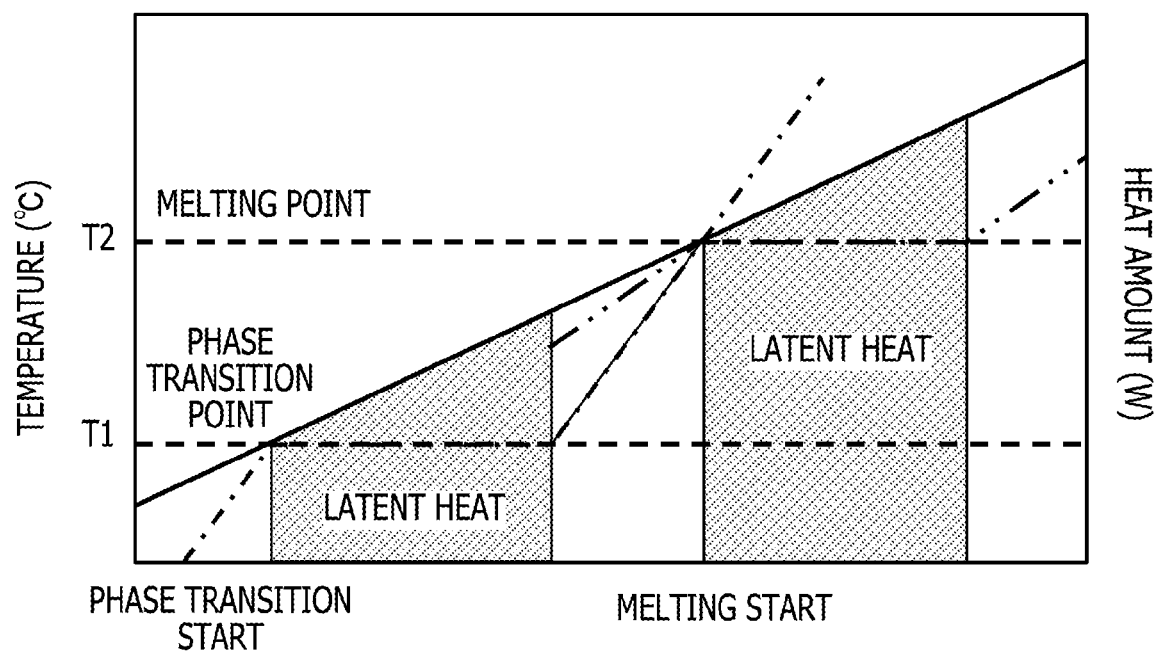
FIG. 7 is a diagram illustrating relationships between temperature changes and amounts of latent heat of a solid-solid phase transition system heat storage material and a liquid-solid phase transition system heat storage material in the thermoelectric conversion module according to the first embodiment.

Here, it is assumed that a transition temperature of a solid-solid phase transition system heat storage material (first heat storage material) is T1, a transition temperature of a liquid-solid phase transition system heat storage material (second heat storage material) is T2. In this case, "T1≠T2" is satisfied, and any of "T1>T2" and "T1<T2" may be satisfied, however, it is assumed that "T1<T2" is satisfied. In addition, it is assumed that the temperature of the heat source is T, and the temperature gradually increases from "T<T1" to "T>T2". In addition, FIG. 7 is a diagram illustrating relationships between the amounts of latent heat and temperatures changes in the solid-solid phase transition system heat storage material and the liquid-solid phase transition system heat storage material.

In a case in which the temperature of the solid-solid phase transition system heat storage material is TI, and the temperature of the liquid-solid phase transition system heat storage material is TII, when "TI<T1" is satisfied, "T1" changes depending on the amount of the heat that flows from the heat source having the temperature T through the thermoelectric conversion element, and therefore, when a Seebeck coefficient that is a characteristic of the thermoelectric conversion element is Z (V/K), an open circuit voltage $V_{OC}$ is expressed by the following equation (1).

$$V_{OC}=Z\times(T-TI) \tag{1}$$

The thermoelectric conversion element is interposed between at least the heat source and the solid-solid phase transition system heat storage material, and therefore, a temperature difference is generated between the heat source and the solid-solid phase transition system heat storage material depending on the thermal resistance $R_{th}$ of the thermoelectric conversion element. While "T" changes, "T=TI" is not satisfied.

When the temperature reaches "TI=T1", the solid-solid phase transition system heat storage material starts the phase transition, and the temperature does not change until the amount of the latent heat is exhausted (see the dot dash line in FIG. 7).

The open circuit voltage $V_{OC}$ at that time is expressed by the following equation (2).

$$V_{OC}=Z\times(T-T1) \tag{2}$$

As "T" continues to rise, "T−T1" becomes large, and the amount of power generation is increased by the thermoelectric conversion element.

A liquid-solid phase transition heat storage material has a low thermal conductivity and a large thermal resistance, and therefore, the liquid-solid phase transition system heat storage material functions as a heat insulation member while the latent heat of the solid-solid phase transition system heat storage material is used, and therefore, the latent heat may be efficiently used.

After that, when the phase transition of the solid-solid phase transition system heat storage material ends, that is, when the amount of the latent heat is exhausted, "TI>T1" is satisfied, and the temperature rises (see the dot dash line in FIG. 7).

While "TII<T2" is satisfied, the liquid-solid phase transition system heat storage material is in a solid state, however, when the temperature of the solid-solid phase transition system heat storage material further rises, and "TII=T2" is satisfied, the phase transition of the liquid-solid phase transition system heat storage material starts, that is, melting of the liquid-solid phase transition system heat storage material starts, and the temperature does not change until the amount of the latent heat is exhausted, that is, the liquid-solid phase transition system heat storage material is completely melted (see the dot-dot dash line in FIG. 7).

The open circuit voltage $V_{OC}$ at that time is expressed by the following equation (3).

Here, it is assumed that the thermal resistance of the thermoelectric conversion element is $R_{th}$, and the thermal resistance of the solid-solid phase transition system heat storage material is $R_{sol}$.

$$V_{OC}=Z\times(T-TII)=Z\times(R_{th}\times(T-T2)/(R_{th}+R_{sol})) \tag{3}$$

Here, the size of the open circuit voltage $V_{OC}$ is set depending on the thermal resistance $R_{sol}$ of the solid-solid phase transition system heat storage material.

Therefore, a desired volume and a thermal resistance at that time are calculated by setting the amount of latent heat desired for the solid-solid phase transition system heat storage material at 50000 J.

For example, when a vanadium oxide is used as the solid-solid phase transition system heat storage material, 1.25 kgs of the vanadium oxide is desired because the latent heat is 40 kJd/kg, however, 290.7 $cm^3$ of the vanadium oxide is desired because the density is 4.3 $g/cm^3$. When the bottom plane size is 10 cm×10 cm, the height is 2.91 cm. The thermal conductivity of the vanadium oxide is 5 W/mK, and therefore, the thermal resistance is obtained by the following equation (4).

$$(1/5)\times2.91\times10^{-2}/(10\times10^{-2})-2=0.58 \tag{4}$$

As described above, when the vanadium oxide is used for the solid-solid phase transition system heat storage material, the thermal resistance $R_{sol}$ is 0.58K/W, which is very small, and therefore, a large open circuit voltage is obtained, and the large amount of power generation is also obtained.

In addition, the thermal resistance is very small, and therefore, the solid-solid phase transition system heat storage material may function as a heat transfer member (heat transfer component) to the liquid-solid phase transition system heat storage material 3 outside the latent heat usable temperature range of the solid-solid phase transition system heat storage material by using the latent heat of the solid-solid phase transition system heat storage material and the low thermal resistance.

On the other hand, when paraffin is used instead of the vanadium oxide, 0.25 kg of the paraffin is desired because the latent heat is 200 kJ/kg, which is a small amount; however, 324.7 $cm^3$ of the paraffin is desired because the density is 0.77 $g/cm^3$. When the bottom plane size is 10 cm×10 cm, the height is 3.25 cm. The thermal conductivity of the paraffin is 0.15 W/mK in the liquid phase, and therefore, the thermal resistance is obtained by the following equation (5).

$$v(1/0.15) \times 3.25 \times 10^{-2}/(10 \times 10^{-2})^{-2} = 21.65 \quad (5)$$

As described above, when the paraffin is used, the thermal resistance $R_{sol}$ is 21.65 K/W which is 37 times larger than the case in which the vanadium oxide is used, and therefore, the open circuit voltage becomes small, and the amount of the power generation is decreased.

In addition, the thermal resistance is large, and therefore, the heat loss is large, and it is difficult to efficiently transfer the heat from the thermoelectric conversion element to the heat storage material. Thus, it is difficult to make the liquid-solid phase transition system heat storage material such as the paraffin function as a heat transfer member in the case in which two types of heat storage materials having different transition temperatures are used.

Thus, in the thermoelectric conversion module according to the embodiment, there is an effect in which the amount of power generation is increased without causing an increase in the size of the thermoelectric conversion module.

In particular, a latent heat usable temperature area of the thermoelectric conversion module 5 is expanded, and the amount of power generation per one thermoelectric conversion module 5 is increased.

That is, as described above, the thermoelectric conversion module 5 according to the embodiment is a highly efficient latent usage thermoelectric power generation apparatus that enables efficient usage of latent heat of at least two types of heat storage materials having different transition temperatures.

Heat is transferred to the solid-solid phase transition system heat storage material that constitutes the first heat transfer member 4 through the thermoelectric conversion element 1 by heating from the heat source 7, however, the temperature of the solid-solid phase transition system heat storage material does not change so much until the transition heat is used, and therefore, in the thermoelectric conversion element 1, the large amount of power generation is obtained increased due to a large temperature difference between the heat source 7 and the solid-solid phase transition system heat storage material that constitutes the first heat transfer member 4.

When the temperature of the heat source 7 further rises, the temperature of the solid-solid phase transition system heat storage material that constitutes the first heat transfer member 4 changes in accordance with a temperature change in the heat source 7, however the heat storage material has a high heat transfer property, and therefore, the thermal resistance of the heat storage material is small, and transfer of the heat from the thermoelectric conversion element 1 to the heat storage material 3 is not suppressed.

The temperature of the heat storage material 3 does not change so much because of usage of the latent heat, and therefore, in the thermoelectric conversion element 1, the large amount of power generation is obtained due to a large temperature difference between the heat storage material 3 and the heat source 7.

As described above, even when the temperature range of the heat source 7 is different, that is, even when an average temperature of the heat source 7 changes, the large amount of power generation is obtained.

Thus, for example, electricity may be generated even when it is day or night using the thermoelectric conversion element 1 under an environment where the temperature difference between one surface and the other surface of a structure body of the thermoelectric conversion element 1 is reversed at day and night such as a manhole.

Figure 8A:
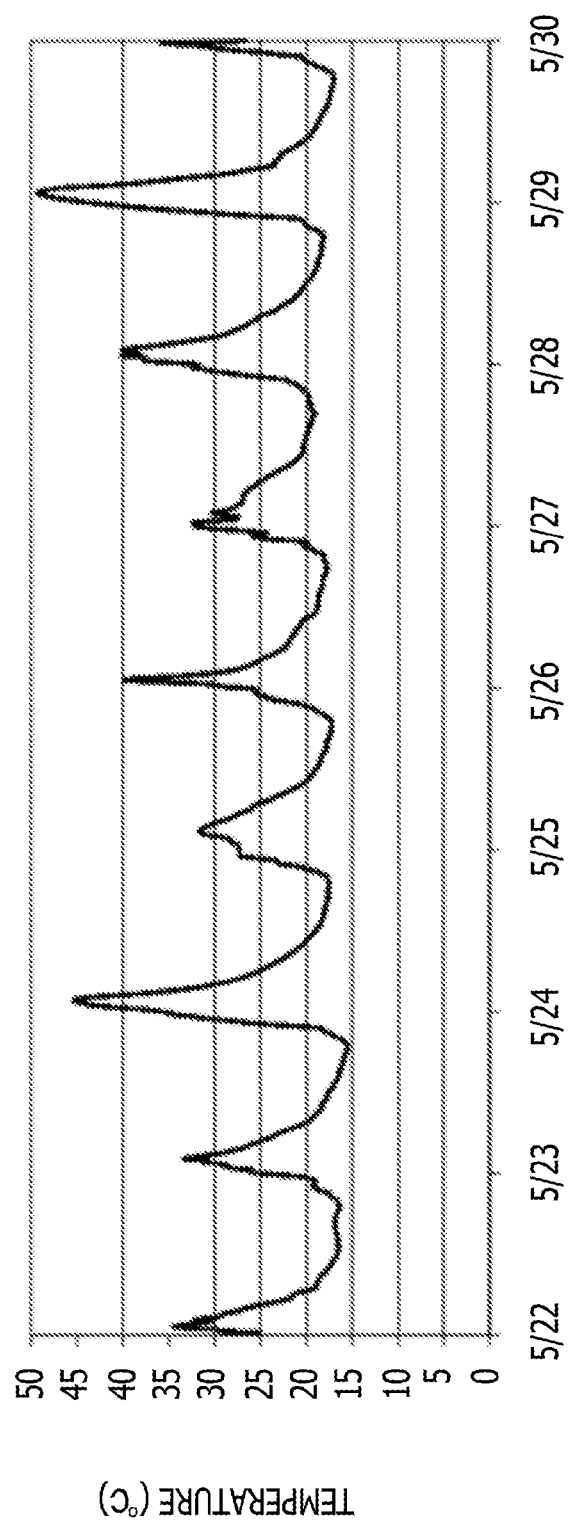
FIG. 8A is a diagram illustrating a temperature change in a lid of a manhole, which is measured from May 22 to May 30.
Figure 8B:
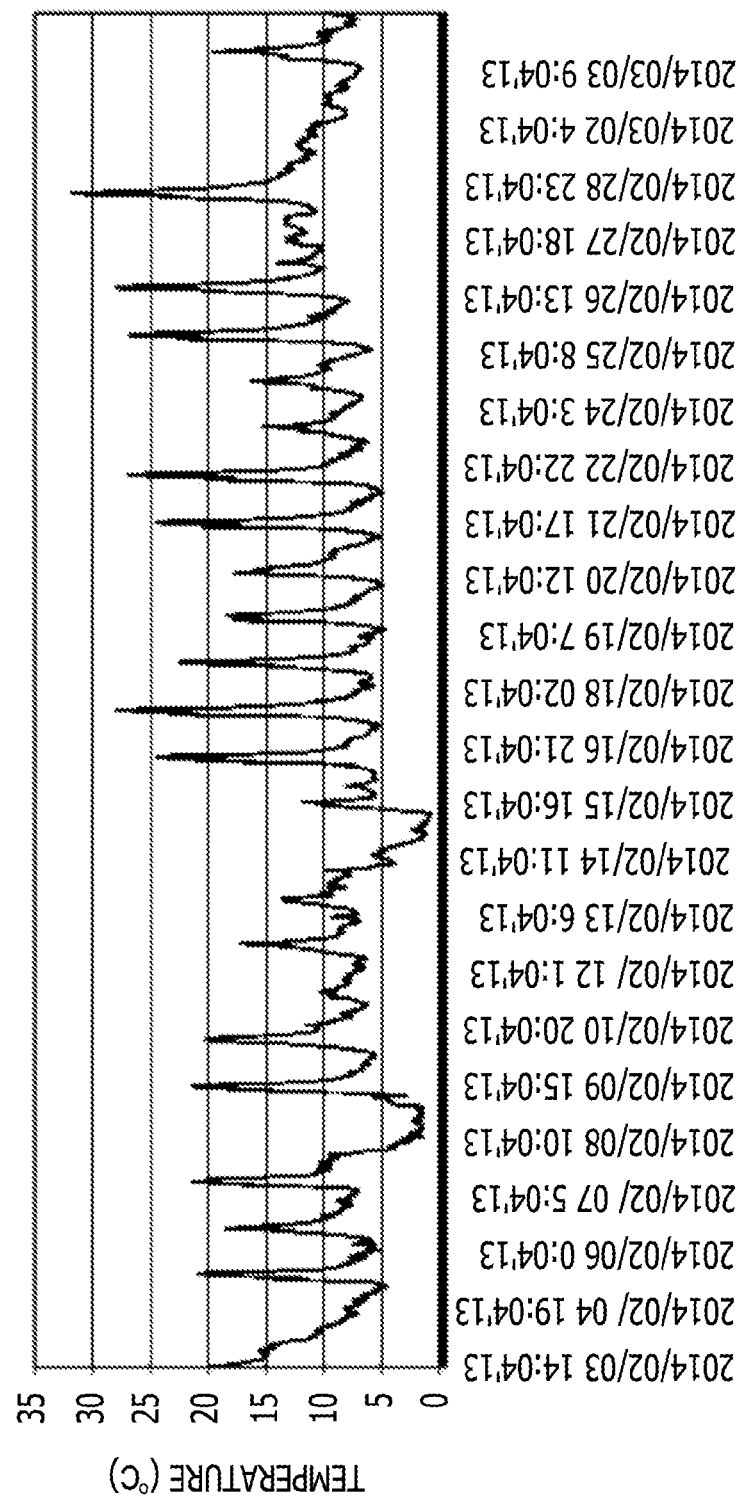
FIG. 8B is diagram illustrating a temperature change in the lid of a manhole, which is measured on February 3 to March 3.

For example, the temperature of the lid of the manhole changes every season, however the temperature has substantially the same amplitude of the cycle fluctuation within a given week or month. On a sunny day, the difference between the maximum value and the minimum value is 25 to 30° C. in summer and 15 to 20° C. in winter, which is rather large. Here, FIG. 8A illustrates a temperature change in the lid of the manhole, which is measured from May 22 to May 30, and FIG. 8B illustrates a temperature change in the lid of the manhole, which is measured from February 3 to March 3.

When the lid of the manhole in which such a cyclical temperature change is repeated is a heat source, usage of a heat storage material on the cooling side (heat dissipation side) is an optimal choice. In this case, due to usage of a heat storage material having a melting point at the center temperature of the maximum value and the minimum value of the cyclical temperature change in the lid of the manhole, melting and solidification are repeated in a one-day cycle, and therefore, the latent heat of the heat storage material is used at maximum.

In the thermoelectric power generation using the temperature of the lid of the manhole, power generation using a difference between the temperature of the lid of the manhole and the temperature in the manhole is conceived, however, in the power generation using not a heat storage material but only a heat sink, a temperature difference generated in the thermoelectric conversion element is much smaller than the temperature difference between the temperature of the lid of the manhole and the temperature in the manhole. Thus, only the small amount of power generation is obtained. On the other hand, when the heat storage material is used on the cooling side, a temperature difference generated in the thermoelectric conversion element becomes the temperature difference between the lid of the manhole and the temperature of the heat storage material, which is large, and therefore, the large amount of power generation is obtained. For example, the sufficient amount of power generation desired for a manhole sensor assumed for data transmission by wireless communication is obtained. In addition, the large amount of power generation is obtained without deterioration through aging.

In particular, as described above, due to usage of two types of heat storage materials having different transition temperatures, even when an average temperature of the heat source 7 changes, the large amount of power generation is obtained.

The above-described configuration is employed due to the following reasons.

The thermoelectric conversion element is mainly constituted by two or more p-type thermoelectric semiconductors and n-type thermoelectric semiconductors, and has a function to directly convert heat energy into electric energy and directly convert electric energy into heat energy. When a temperature difference is applied to both ends of the thermoelectric conversion element, a voltage is generated by the Seebeck effect. Extraction of such a voltage as electric energy is performed by a thermoelectric power generation apparatus.

Such a thermoelectric power generation apparatus allows direct energy conversion from heat energy to electric energy, and therefore, the thermoelectric power generation apparatus has been attracting attention as one of valid usage methods of heat energy typified by waste heat usage.

A typical thermoelectric conversion element has a structure in which a thermoelectric pair is formed by pairing a pillar-shaped p-type thermoelectric semiconductor and n-type thermoelectric semiconductor having substantially the same length at both ends of the thermoelectric conversion element, and two or more thermoelectric pairs are arranged in a planar manner such that the p-type thermoelectric semiconductors and the n-type thermoelectric semiconductors are alternately arranged in a regular pattern, and the thermoelectric pairs are electrically coupled in series.

Wiring that realizes electrical connection is, for example, formed on two substrates made of Si or a ceramic material, and the substrate has a structure in which the substrates face each other with gaps corresponding to the thickness of the p-type thermoelectric semiconductor and the n-type thermoelectric semiconductor and an electrode that connects the thermoelectric semiconductors.

One of the substrates is brought into contact with the heat source (heat generation source) and the other substrate releases the heat, and therefore, a temperature difference is generated in the thermoelectric semiconductor pair. To continuously generate a temperature difference, a heat radiating component is attached to the substrate on the heat radiation side.

In a case of natural air cooling, it is common to use a heat sink in which alumite treatment is executed for aluminum (aluminum is anodized) to form an aluminum oxide film on the surface, as a heat radiation component.

The power generation by the thermoelectric conversion element may be performed anywhere as long as there is a temperature difference; however, the power generation depends on a naturally-controlled temperature, which is left to natural devices.

For example, when a concrete or a metal to be heated by solar heat is selected as a heat source, and a thermoelectric conversion element is attached thereto, the heat from heat source is dissipated to the atmosphere through the heat sink to generate a temperature difference in the thermoelectric conversion element and generate electricity.

However, in the thermoelectric conversion module, even when the surface area of a fin of the heat sink is increased, it is difficult to maintain the temperature on the side of the thermoelectric conversion element, on which the heat sink is disposed the same as the outside air temperature.

Thus, a temperature difference generated between the upper and lower surfaces of the thermoelectric conversion element becomes smaller than the temperature difference between the outside air temperature and the high temperature heat source. Therefore, the amount of power generated by the thermoelectric conversion module also decreases.

In addition, there are some thermoelectric conversion modules each of which causes a temperature difference in a thermoelectric conversion element by using a change over time in the temperature of a heat source. In such a thermoelectric conversion module, the heat source is brought into contact with on one surface of the thermoelectric conversion elements, and a heat storage material is brought into contact with on the other surface. In this case, a heat source the temperature of which is not fixed and changes over time is used.

For example, a motor or a boiler that intermittently repeats operation and pause is used as the heat source. Alternatively, by using the temperature change between daytime and nighttime, a thing left outside such as an exterior wall or a roof of a building or an engine or an exterior of a vehicle such as an automobile is used as the heat source.

Here, although the heat storage material may be made of an organic or inorganic material, however, what is commonly used for the heat storage material is a saturated hydrocarbon type organic matter which is relatively easy to handle. The melting point of the heat storage material ranges various temperatures from −30° C. to 40° C., and the heat storage material is used for air cooling and has been considered to be applied as a building material.

In addition, the heat storage material has a property of maintaining a fixed temperature due to the phase change in the material. Therefore, as the temperature of the heat source changes over time, a temperature difference is caused between the heat source and the heat storage material, and the thermoelectric conversion element generates electricity in accordance with this temperature difference.

In this case, it is desirable that the amount of heat flowing into the thermoelectric conversion element accompanying a temperature change in the heat source over time and the amount of heat flowing out from the thermoelectric conversion element, which are estimated, be equal to or less than the latent heat amount of the heat storage material.

The heat storage material undergoes the phase transition due to the heat transmitted from the heat source through the thermoelectric conversion element, however a fixed temperature is maintained in the heat storage material during the phase transition. Therefore, in a case in which the heat exchange with members other than the heat source is negligible in the whole the thermoelectric conversion module, when an integral value of the amount of the heat flowing into the heat storage material from the heat source through the thermoelectric conversion element reaches a latent heat amount of the heat storage material, the phase transition is completed. Thus, when the integral value exceeds the amount of latent heat of the heat storage material, the temperature of the heat storage material changes in accordance with the amount of the flowing heat depending on the heat capacity, and it becomes difficult to cause a temperature difference between the upper and lower surfaces of the thermoelectric conversion element.

In such a type of the thermoelectric conversion module, a temperature difference is caused between the upper and lower surfaces of the thermoelectric conversion element by using thermal conduction between the heat storage material and the thermoelectric conversion element or between the heat source surface and the thermoelectric conversion element. Thus, as compared with a thermoelectric conversion module having a type that uses heat transfer with the outside air, a temperature difference is caused reliably.

However, when the average temperature of the heat source that the temperature of which changes is a transition point (transition temperature) of the heat storage material, the heat storage material works most effectively, and therefore, it is difficult to fully demonstrate the strength in the heat source in which the average temperature changes.

A building that is installed outdoors and heated by the radiant heat of the sun is conceived as such a heat source. The temperature of the building exposed to the sun rises with the sunrise and falls after the peak around daytime, and the daily temperature cycle is repeated with the temperature in the early dawn as the lowest temperature, however, since the radiant heat of the sun varies according to the season, and therefore, the average temperature changes.

Therefore, to increase the amount of power generation, for example, it is conceivable to use two or more heat storage materials having different operation temperatures (transition temperatures).

In this case, it is conceivable that two or more heat storage materials are stored in different containers, and heat is transferred to the heat storage materials through the respective containers.

However, the thermoelectric conversion module becomes large n this case.

Therefore, it is assumed that, to increase the amount of power generation without increasing in the size of the thermoelectric conversion module, as described above, two types of heat storage materials having different transition temperature (operation temperature) are used, and a solid-solid phase transition system heat storage material is used as one of the heat storage materials, and the heat storage material 3 is accommodated in the container 2, and the first heat transfer member 4 is used to transfer the heat from the heat source 7 to the heat storage material 3 through the thermoelectric conversion element 1, and the first heat transfer member 4 includes a portion made of a solid-solid phase transition system heat storage material.

For example, in a case in which n types of heat storage materials are used, when n thermoelectric conversion modules including n thermoelectric conversion elements respectively corresponding to the n types of heat storage materials are prepared, the cost increases n times, and the space also increases n times, which is not preferable.

In addition, for example, it is conceivable to use two or more liquid-solid phase transition system heat storage materials having different transition points for one thermoelectric conversion module, mix the materials, and put the materials in the container, however, as compared with the case in which a liquid-solid phase transition system heat storage material is used alone, the melting points do not clearly appear, and the effect of latent heat usage decreases, which is not preferable.

In addition, for example, even in a case in which two or more liquid-solid phase transition system heat storage materials having different transition points are used for one thermoelectric conversion module and respectively stored in spaces obtained by partitioning the container, when thermoelectric conversion elements are disposed in the respective spaces, the cost increases, and a large space is to be prepared, which is not preferable. In addition, open circuit voltages output from the respective thermoelectric conversion elements are different, and therefore, the thermoelectric conversion elements are to be electrically coupled to each other to combine the outputs to use the thermoelectric conversion elements for a single thermoelectric conversion module, however, the electromotive forces are different and unstable, thereby being difficult to achieve as in the example.

In a case of a temperature zone that exists in a typical environment in which the temperature of a heat source ranges −10° C. to 80° C., as a heat storage material, typically, a liquid-solid phase transition system heat storage material in which the melting point is a transition point is used.

However, such a heat storage material has a very low thermal conductivity, and it is known that a representative value of the thermal conductivity is about 0.1 to 0.6 W/mK.

Thus, even when the heat storage material is brought into contact with the thermoelectric conversion element, only a portion of a heat storage material portion, which is adjacent to the thermoelectric conversion element, is repeatedly melted and solidified. As a result, the heat is not conducted up to a portion of a heat storage material, which is away from the thermoelectric conversion element, and it is difficult to derive the performance of the whole heat storage material.

Therefore, for example, in a thermoelectric conversion module as illustrated in FIG. 9, in a metal heat sink 4X including a fin 4XB and a base part 4XA, the fin 4XB is inserted into the heat storage material 3, and therefore, the efficiency of heat conduction with the heat storage material 3 is improved. The two or more fins 4XB are brought into contact with the thermoelectric conversion element 1 and inserted into the heat storage material 3 in parallel with each other. More specifically, each of the fins 4XB is inserted into the heat storage material 3 up to a predetermined depth from above. The fins 4XB are inserted into the heat storage material 3 as described above, and therefore, a portion of the heat storage material 3, which is melted, travels from the upper surface side to the lower side along the fins 4XB. As a result, the heat storage material 3 is liable to melt in a wider area.

Therefore, as described above, it is assumed that the first heat transfer member 4 is immersed in the heat storage material 3, and the fin 4B is disposed so as to extend in a direction away from the thermoelectric conversion element 1 to achieve efficient improvement of heat conduction to the heat storage material 3. That is, the heat sink 4 that includes the fin 4B and the base part 4A and is made of a solid-solid phase transition system heat storage material is used instead of the metal heat sink 4X including the fin 4XB and the base part 4XA, and therefore, the amount of power generation is increased without increasing the size of the thermoelectric conversion module 5, and the efficiency of heat conduction to the heat storage material 3 is improved.

In the above-described embodiment, the second heat transfer member 6 is included in the container 2, and the thermoelectric conversion element 1 is accommodated in the container 2, and the other side of the thermoelectric conversion element 1 is thermally coupled to the second heat transfer member 6, however, the embodiment is not limited to such a case.

For example, as illustrated in FIG. 10, the second heat transfer member 6 may be disposed outside the container (first container) 2, and the thermoelectric conversion element 1 may be disposed outside the container 2, and the other side of the thermoelectric conversion element 1 may be thermally coupled to the second heat transfer member 6. Here, the second heat transfer member 6 and the thermoelectric conversion element 1 are disposed outside the container 2, and the fin 4B that constitutes the first heat transfer member 4 is inserted and immersed in the heat storage material 3 accommodated in the container 2, and the base part 4A of the first heat transfer member 4 is disposed outside the container 2. The substrate 10 on which the thermoelectric conversion element 1 is mounted is also disposed outside the container 2, however, in this case, it is preferable that the thermoelectric conversion element 1 be sealed by a sealing member 12 such that a space is formed around the thermoelectric conversion element 1. Even in the above-described embodiment, similarly, the thermoelectric conversion element 1 may be sealed by a sealing member such that a space is formed around the thermoelectric conversion element 1.

Figure 11:
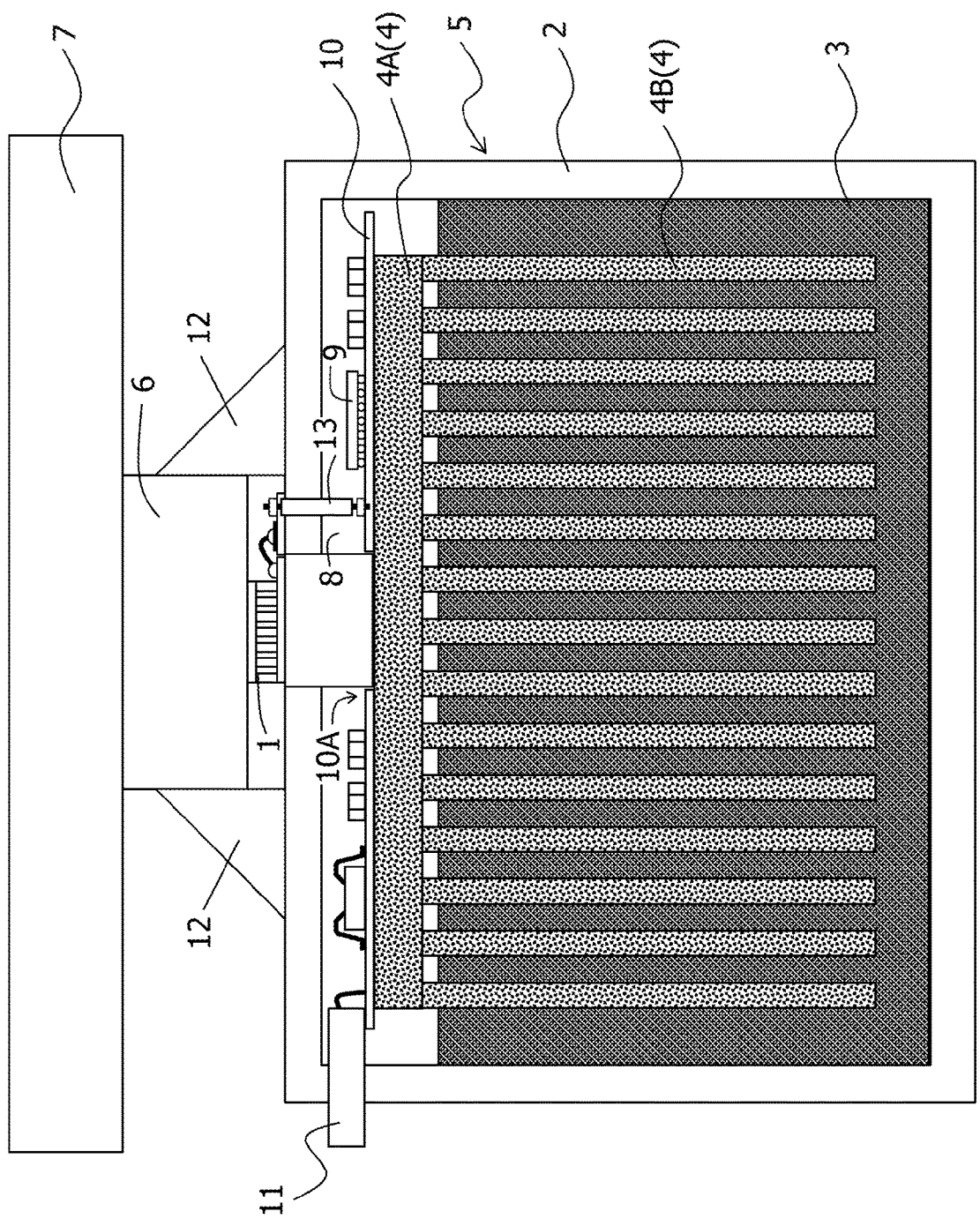
FIG. 11 is a schematic cross-sectional view illustrating a configuration of a modification of the thermoelectric conversion module according to the first embodiment.

In addition, for example, as illustrated in FIG. 11, it is assumed that the second heat transfer member 6 is disposed outside the container 2 and a third heat transfer member 8 that has a thermal conductivity higher than that of the container 2 is accommodated in the container 2, and the thermoelectric conversion element 1 may be disposed outside the container 2, and one side of the thermoelectric conversion element 1 may be thermally coupled to the first heat transfer member 4 through the third heat transfer member 8, and the other side of the thermoelectric conversion element 1 may be thermally coupled to the second heat transfer member 6. That is, in the above-described embodiment, the thermoelectric conversion element 1 and the second heat transfer member 6 may be disposed outside the container 2, and the one side of the thermoelectric conversion element 1 may be thermally coupled to the first heat transfer member 4 through the third heat transfer member 8. In this case, it is sufficient that the third heat transfer member 8 is disposed in the opening 10A of the substrate 10 accommodated in the container 2, and the thermoelectric conversion element 1 is electrically coupled to the substrate 10, for example, through a connector 13. In addition, it is preferable that the thermoelectric conversion element 1 sandwiched by the third heat transfer member 8 and the second heat transfer member 6 be sealed by the sealing material 12 such that a space is formed around the thermoelectric conversion element 1. In addition, the second heat transfer member 6 is thermally coupled to the heat source 7. The third heat transfer member 8 is also referred to as a heat dissipation side heat transfer member, and the second heat transfer member 6 is also referred to as a heat source side (heat absorption side) heat transfer member.

Examples

The technology discussed herein is further described below in detail with reference to examples. The technology discussed herein is not limited to such examples.

Figure 12A:
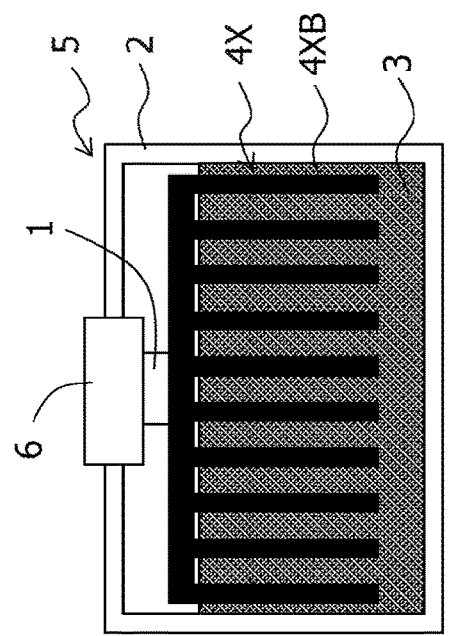
FIG. 12A is a schematic cross-sectional view illustrating a configuration of a thermoelectric conversion module according to an example 1.

In an example, two types of heat storage materials such that the solid-solid phase transition system heat storage material (first heat storage material) and a liquid-solid phase transition system heat storage material (second heat storage material) are used, and the solid-solid phase transition system heat storage material is used as the first heat transfer member 4 to prepare a thermoelectric conversion module 5 [see FIG. 12A].

That is, the liquid-solid phase transition system heat storage material 3 is accommodated in the resin container 2, and the solid-solid phase transition system heat storage material as the first heat transfer member 4 is coupled to the one side of the thermoelectric conversion element 1, and the solid-solid phase transition system heat storage material 4 is immersed in the heat storage material 3. In addition, the other side of the thermoelectric conversion element 1 is coupled to an aluminum member as the second heat transfer member 6 attached to the resin container 2 to prepare the thermoelectric conversion module 5 [see FIG. 12A].

Figure 12B:
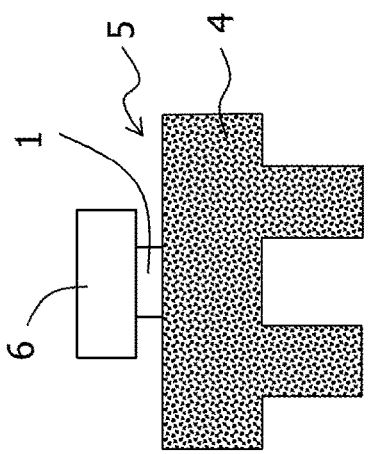
FIG. 12B is a schematic cross-sectional view illustrating a configuration of a thermoelectric conversion module according to a comparative example 1.

In addition, in a comparative example 1, only a solid-solid phase transition system heat storage material 4 (first heat storage material) is used to prepare the thermoelectric conversion module 5 [see FIG. 12B].

That is, the solid-solid phase transition system heat storage material as the first heat transfer member 4 is coupled to the one side of the thermoelectric conversion element 1, and the aluminum member as the second heat transfer member 6 is coupled to the other side of the thermoelectric conversion element 1 to prepare the thermoelectric conversion module 5 [see FIG. 12B].

Figure 12C:
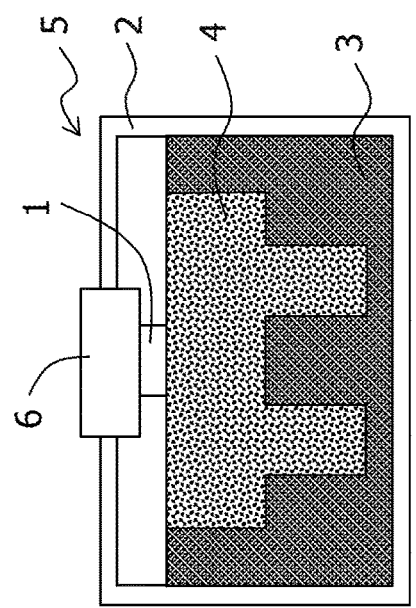
FIG. 12C is a schematic cross-sectional view illustrating a configuration of a thermoelectric conversion module according to a comparative example 2.

In addition, in a comparative example 2, only a liquid-solid phase transition system heat storage material 3 (second heat storage material) is used to prepare the thermoelectric conversion module 5 [see FIG. 12C].

That is, in the comparative example 2, the liquid-solid phase transition system heat storage material 3 is accommodated in the resin container 2, and the aluminum heat sink 4X is coupled to the one side of the thermoelectric conversion element 1, and the fin 4XB of the aluminum heat sink 4X is immersed in the liquid-solid phase transition system heat storage material 3 accommodated in the resin container 2. In addition, the other side of the thermoelectric conversion element 1 is coupled to the aluminum member as the second heat transfer member 6 attached to the resin container 2 to prepare the thermoelectric conversion module 5 [see FIG. 12C].

In the thermoelectric conversion modules 5 according to the examples, and the comparative examples 1 and 2, as the thermoelectric conversion element 1, single 9501/127/060B (Seebeck coefficient: 0.057 V/K, electric resistance value: 3.27Ω, and thermal resistance value: 0.45 W/K) manufactured by Ferrotec Corporation is used.

In addition, the thermoelectric conversion element 1 is heated by a heater through the aluminum member as the second heat transfer member 6. Here, as the heat source, the lid of a manhole is assumed. It is known that an average temperature of the lid of the manhole in Tokyo is about 20° C. in spring and autumn, is about 30 to 35° C. in summer, and is about 10° C. in winter, and therefore, the annual average temperature is about 20° C. Therefore, to check the amount of power generation in spring, autumn, and summer in each of the thermoelectric conversion modules 5 according to the example and the comparative examples 1 and 2, the thermoelectric conversion element 1 is heated by a heater.

In addition, in the thermoelectric conversion modules 5 according to the examples, the solid-solid phase transition system heat storage material (first heat storage material) is selected that has the transition point close to 20° C., which is the annual average lid temperature, and the liquid-solid phase transition system heat storage material (second heat storage material) is selected that has the transition point close to 30° C., which is the average lid temperature in summer. Here, the heat transfer amount 50000 J from the manhole in spring and autumn is desired as the latent heat, and 1.25 kgs of a vanadium oxide based latent heat storage material manufactured by Nippon Denko Co., Ltd. having a transition point of 20° C. and a latent heat of 40 kJ/kg is used as the solid-solid phase transition system heat storage material (first heat storage material). In addition, the heat transfer amount 78000 J from the manhole in summer is desired as the latent heat, and 380 g of Passamo F30 (melting point of 31.5° C., latent heat of fusion of 205 kJ/kg) manufactured by Kaneka Corporation, which is a paraffin-based heat storage material, is used as the liquid-solid phase transition system heat storage material (second heat storage material).

In the thermoelectric conversion module 5 according to the comparative example 1, the solid-solid phase transition system heat storage material (first heat storage material) is selected that has an annual average lid temperature of 20° C. close to the transition point. Here, the amount of latent heat of the solid-solid phase transition system heat storage material (first heat storage material) is set at 78000 J in accordance with the amount of heat transfer from the manhole in summer. Specifically, 1.95 kgs of a vanadium oxide-based latent heat storage material manufactured by Nippon Denko Co., Ltd. having a transition point of 20° C. and a latent heat of 40 kJ/kg is used as the solid-solid phase transition system heat storage material (first heat storage material).

In the thermoelectric conversion module 5 according to the comparative example 2, the liquid-solid phase transition system heat storage material (second heat storage material) is selected that has the annual average lid temperature of 20° C. close to the transition point. Here, the amount of the latent heat of the liquid-solid phase transition system heat storage material (second heat storage material) is set at 78000 J in accordance with the amount of heat transfer from the manhole in summer. Specifically, 360 g of Passamo F20 (melting point of 20.6° C., latent heat of fusion of 220 kJ/kg) manufactured by Kaneka Corporation, which is a paraffin-based heat storage material, is used as the liquid-solid phase transition system heat storage material (second heat storage material).

In addition, each of the thermoelectric conversion modules 5 prepared as described above is heated by a heater to obtain the amount of power generation.

As a result, in the thermoelectric conversion module 5 according to the example, in the case of the average lid temperature of 20° C. in spring and autumn, the amount of the power generation is 61.0 J/day, and in the case of the average lid temperature of 30° C. in summer, the amount of the power generation is 82.1 J/day.

On the other hand, in the thermoelectric conversion module 5 according to the comparative example 1, in the case of the average lid temperature of 20° C. in spring and autumn, the amount of the power generation is 61.4 J/day, and in the case of the average lid temperature of 30° C. in summer, the amount of the power generation is 22 J/day.

In addition, in the thermoelectric conversion module 5 according to the comparative example 2, in the case of the average lid temperature of 20° C. in spring and autumn, the amount of the power generation is 53.7 J/day, and in the case of the average lid temperature of 30° C. in summer, the amount of the power generation is 65.3 J/day.

As described above, in any case of the average lid temperature of 20° C. in spring and autumn and the average lid temperature of 30° C. in summer, it has been confirmed that more power is reliably generated in the thermoelectric conversion module 5 according to the example than in the thermoelectric conversion module 5 according to the comparative example 2. In addition, it has been confirmed that, in the case of the average lid temperature of 20° C. in spring and autumn, the amount of the power generation is similar, however, in the case of the average lid temperature of 30° C. in summer, the amount of the power generation considerably increases as compared with the thermoelectric conversion module 5 according to the comparative example 1.

That is, in the thermoelectric conversion module 5 according to the example, two types of heat storage materials such as the solid-solid phase transition system heat storage material (first heat storage material) and the liquid-solid phase transition system heat storage material (second heat storage material) are used, and the solid-solid phase transition system heat storage material is used as the first heat transfer member 4, and therefore, it has been confirmed that more electricity is generated annually by using only one thermoelectric conversion module 5 (one thermoelectric conversion element 1) without causing an increase in the size.

Second Embodiment

A sensor module and an information processing system according to a second embodiment are described below with reference to FIGS. 13 to 19.

Figure 13:
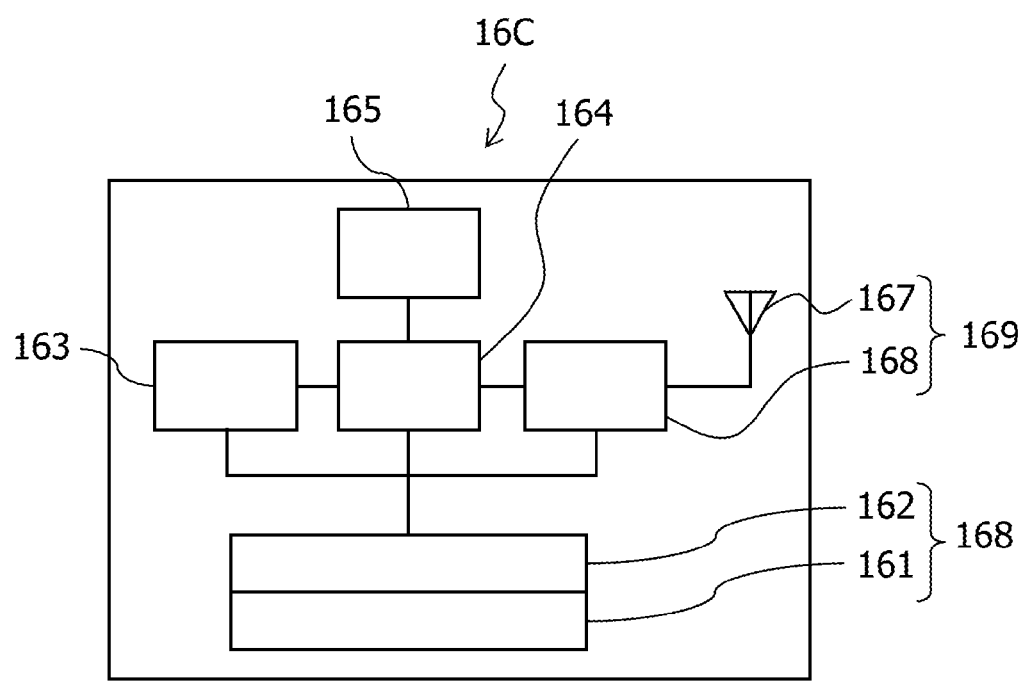
FIG. 13 is a schematic diagram illustrating a configuration of a sensor module according to a second embodiment.

The sensor module according to the embodiment is an integrated module, and as illustrated in FIG. 13, an integrated module 160 includes a power generation module 161, a power storage module 162, a sensor 163, a controller 164, a memory 165, a communication circuit 166, and an antenna 167.

For example, the thermoelectric conversion module 5 according to the above-described first embodiment is applied to the power generation module 161. That is, the power generation module 161 includes the thermoelectric conversion element 1, the container 2, the heat storage material 3, and the first heat transfer member 4 including a portion made of a solid-solid phase transition system heat storage material having a thermal conductivity higher than that of the heat storage material 3 and a transition temperature different from that of the heat storage material 3. Thus, the sensor module includes at least the sensor 163 and the thermoelectric conversion module 5 according to the above-described first embodiment electrically coupled to the sensor 163.

The power storage module 162 is coupled to the power generation module 161 and stores electric power generated in the power generation module 161. It is sufficient that the power storage module 162 has a function to store electric power. As the storage module 162, for example, an all solid-state secondary battery is preferable from the viewpoint of space-saving and safety.

The power generation module 161 and the power storage module 162 constitute an electric power supply unit 168. Electric power is supplied to the sensor 163, the controller 164, and the communication circuit 166 from at least one of the power generation module 161 and the power storage module 162 that constitute the electric power supply unit 168. When stable power is supplied from the power generation module 161, the power storage module 162 may be omitted.

For example, the sensor 163 may a sensor detects the temperature, humidity, pressure, light, sound, electromagnetic wave, acceleration, vibration, gas, fine particles, or the like. In addition, for example, the sensor 163 may be a distance measuring sensor that emits infrared rays to an object and measures a distance to the object in accordance with received light reflected from the object, a weight sensor that measures the weight of the object, or a water level sensor that detects data such as a water level or the like.

The controller 164 transmits, for example, various pieces of data that have been detected by the sensor 163 to a server 175 that is not illustrated through the communication circuit 166 and the antenna 167. For example, the controller 164 may transmit, to the server 175, the various pieces of data that have been detected by the sensor 163 and secondary data based on another data. In addition, the controller 164 may execute certain calculation, for example, by using the various pieces of data that have been detected by the sensor 163 to calculate secondary data and transmits the secondary data to the server 175.

The memory 165 stores the various pieces of data that have been detected by the sensor 163 and the calculated secondary data in response to an instruction of the controller 164. The stored information is read in response to an instruction of the controller 164.

The communication circuit 166 and the antenna 167 constitute a communication unit 169. The communication unit 169 performs transmission and reception of data between the controller 164 and the server 175. In the example illustrated in FIG. 13, a wireless communication using the antenna 167 is used, however, a wired communication may be used instead of the wireless communication.

Figure 14:
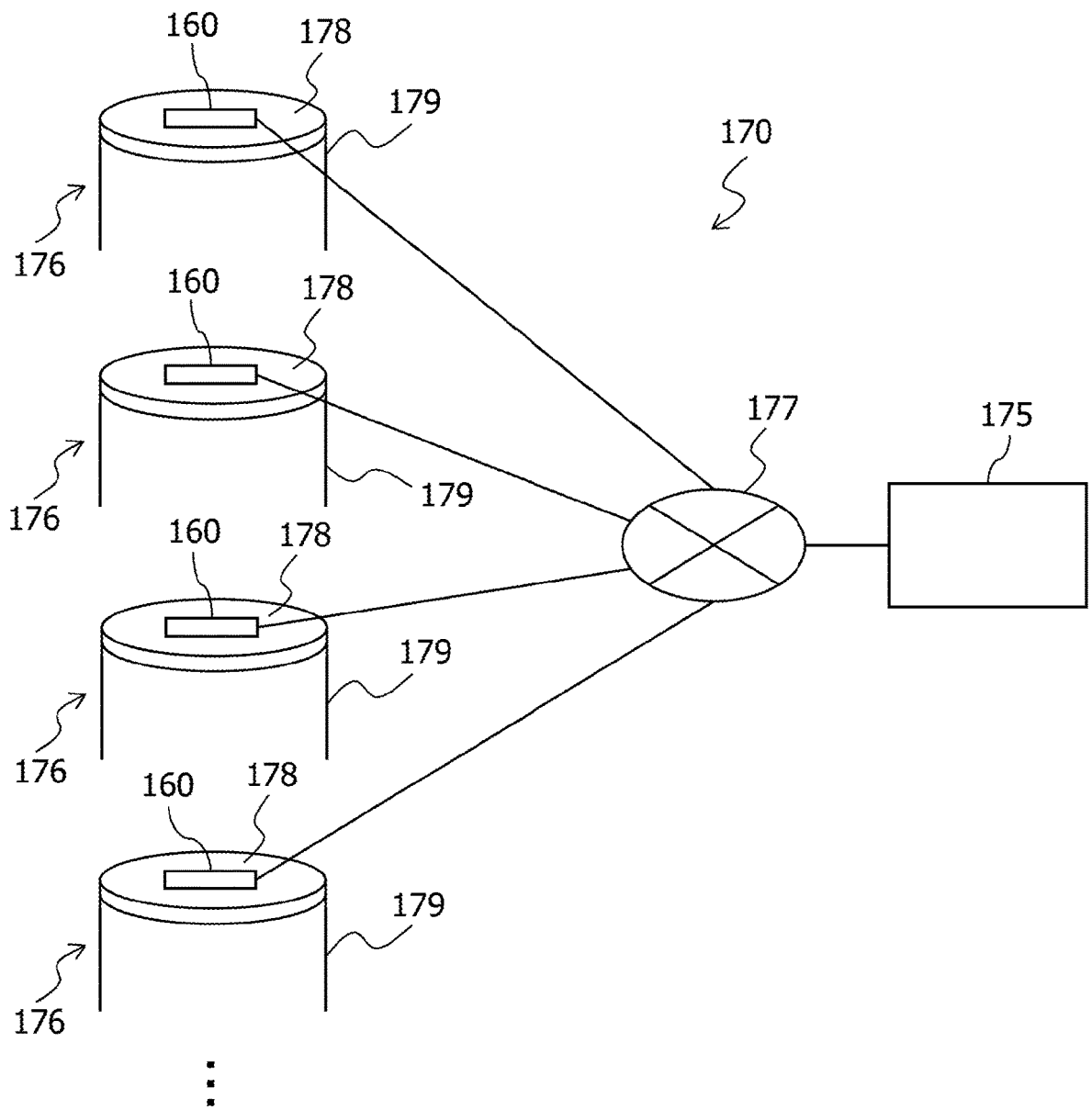
FIG. 14 is a schematic diagram illustrating a configuration of an information processing system using the sensor module according to the second embodiment.

The above-described integrated module 160 is applied, for example, to an information processing system 170 according to the embodiment as illustrated in FIG. 14.

The information processing system 170 includes the two or more integrated modules 160 and the server 175. That is, the information processing system 170 includes the above-described integrated modules (sensor modules) 160 and the server (computer) 175 that processes pieces of data obtained by the integrated modules 160. Here, the information processing system 170 is a system that processes pieces of information obtained from manholes 176. Thus, the two or more integrated modules 160 are installed in the respective manholes 176. The two or more integrated modules 160 respectively installed in the two or more manholes 176 are coupled to the server 175 through a network 177.

For example, data may be transmitted through a short-range wireless communication from the integrated module 160 to the server 175 each time a vehicle including the server 175 travels and approaches the integrated module 160 installed in each manhole 176. In addition, the integrated module 160 may be installed in any structure body of the manhole 176.

The integrated module 160 is fixed to a lid 178, a concrete pipe 179, or the like that is a structure body of the manhole 176 depending on a detection target of the sensor 163 or the type of the sensor 163. A thermoelectric conversion element included in the integrated module 160 is thermally coupled to the structure body of the manhole 176, and power is generated due to a temperature difference between the structure body of the manhole 176 and the outside air or the internal temperature of the manhole 176.

A specific application example of the information processing system 170 according to the embodiment is described below.

First Application Example

Figure 15:
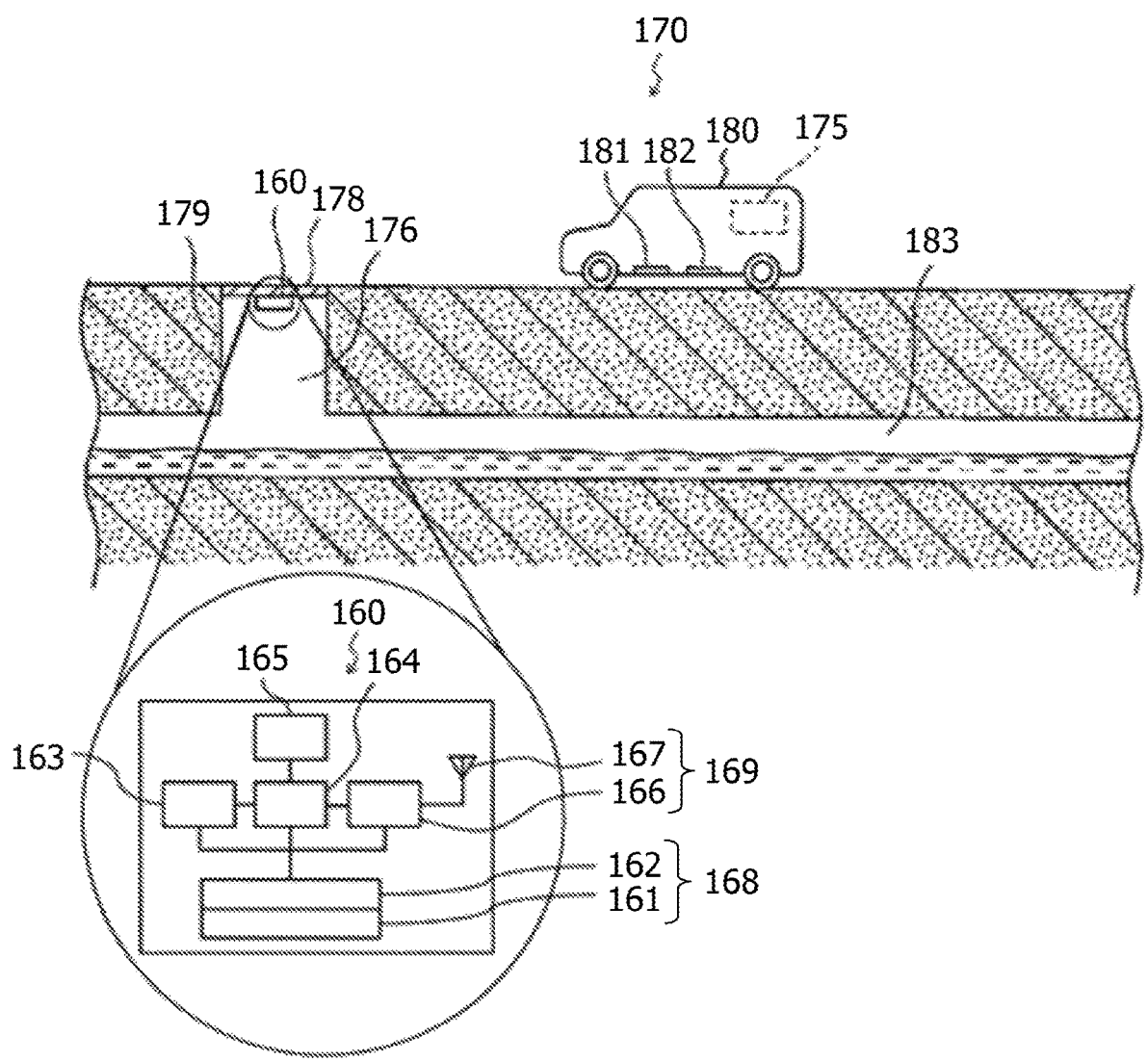
FIG. 15 is a schematic diagram illustrating a first application example of the sensor module and the information processing system according to the second embodiment.

In a first application example, as illustrated in FIG. 15, the information processing system 170 is used for understanding deterioration of the structure body (the lid 178 or the concrete pipe 179) of the manhole 176.

The sensor 163 detects the temperature and the humidity in the manhole 176, the vibration (acceleration) acting on the structure body of the manhole 176, and the data detected by the sensor 163 is accumulated in the memory 165.

When a vehicle 180 for measurement, which travels on the road, passes over the manhole 176 and the like, the controller 164 transmits data accumulated in the memory 165 through the communication circuit 166 and the antenna 167. The server 175 disposed in the vehicle 180 for measurement collects the data.

The server 175 displays the collected data on a map displayed on an in-vehicle monitor by using location information of the vehicle 180 by a global positioning system (GPS) and the collected data. The degree of deterioration of the concrete pipe 179 in each of the manholes 176 may be estimated from displayed information indicating the temperature, the humidity, the vibration, and the like.

In addition, a camera 182 that captures an image of the lid 178 of the manhole 176 is attached to the bottom of the vehicle 180 for measurement together with a reception apparatus 181, and therefore, deterioration of the lid 178 (iron part) of the manhole 176 may be determined by image recognition. In accordance with such a result, a replacement timing of the lid 178 of the manhole 176 may be sold to a local government as information. Here, the vehicle that collects data may not be a special vehicle for measurement, but for example, may be a garbage collection vehicle operated by the local government. The reception apparatus 181 and the camera 182 are installed at the bottom of the garbage collection vehicle, and therefore, data may be collected regularly without collection expense.

In addition, the sensor 163 may detect the concentration of gas generated in the manhole 176. The gas generated in the manhole 176 includes for example, hydrogen sulfide gas. It is known that hydrogen sulfide gas generated in the sewer 183 rapidly deteriorates the structure body of the manhole 176. The generation of the hydrogen sulfide gas also causes complaints of neighborhood residents. A hydrogen sulfide gas sensor is used as the sensor 163, thereby promptly responding to the complaints of the neighborhood residents as well as improving the prediction accuracy of deterioration of the structure body of the manhole 176.

In the first application example, it is sufficient that the sensor 163 is a sensor that detects at least one of the temperature, the humidity, and the vibration in the manhole 176, and the concentration of gas generated in the manhole 176.

In addition, it is likely that humidity is high inside the manhole 176, and water of the sewer 183 (or water supply) may overflow into the manhole 176. In addition, although the interior of the manhole 176 has a substantially fixed temperature, however, it is known that, for example, the lid 178 has a high temperature in summer and a low temperature in winter, and hydrogen sulfide gas or the like that dissolves various metals are generated. In such a harsh environment, it is important to protect electronic components such as the sensor 163 and the thermoelectric conversion elements and to maintain long-term reliability. In this case, the integrated module 160 is implemented as a module obtained by sealing the electronic component such as the sensor 163 and the thermoelectric conversion element with resin, thereby maintaining the long-term reliability.

Second Application Example

Figure 16:
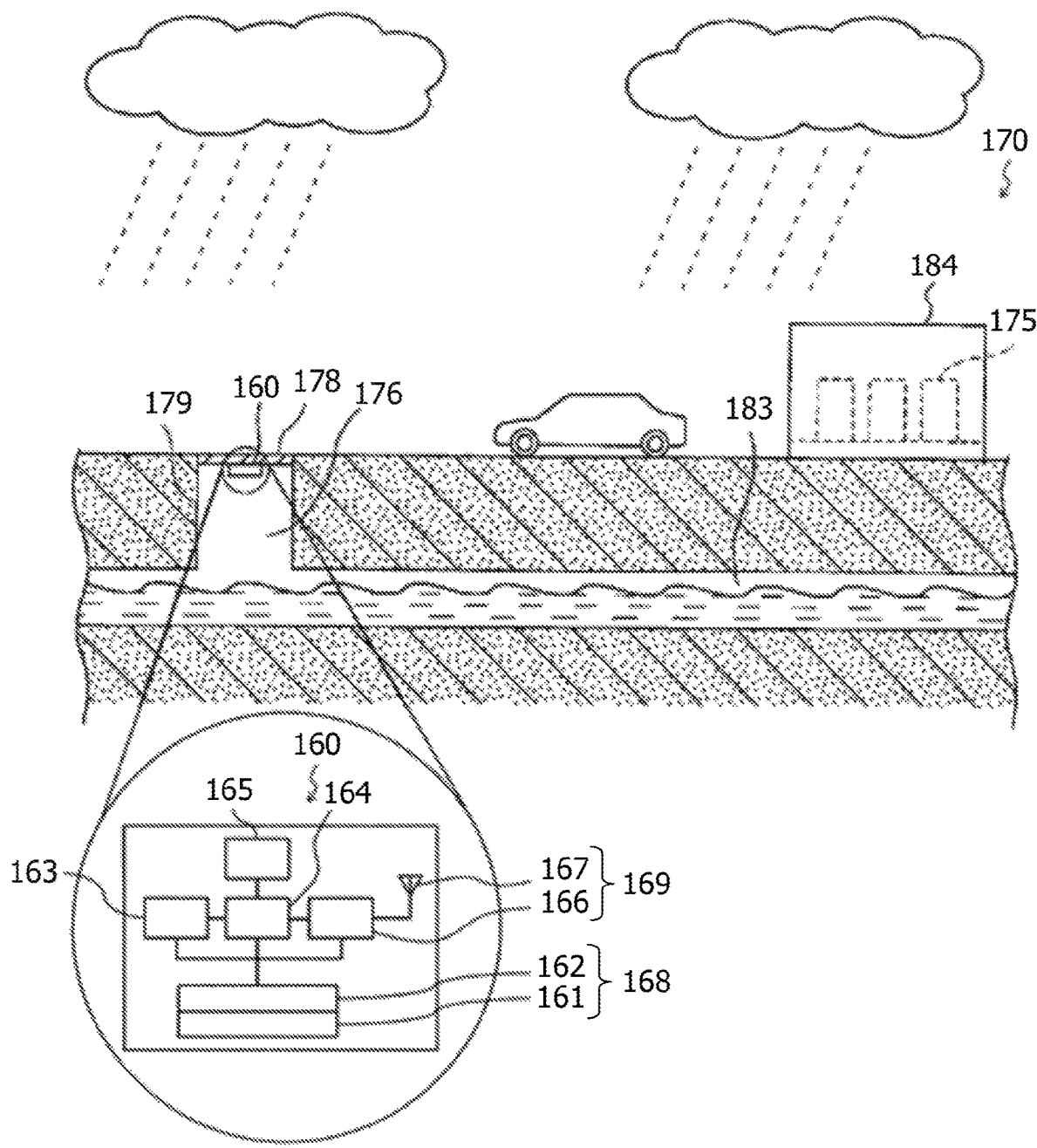
FIG. 16 is a schematic diagram illustrating a second application example of the sensor module and the information processing system according to the second embodiment.

In a second application example, as illustrated in FIG. 16, the information processing system 170 is used for predicting the flow rate of the sewer 183 coupled to the manhole 176.

As the sensor 163, for example, a water level gauge or a flow meter is used. The sensor 163 that is the water level gauge or the flow meter is installed in the manhole 176, and therefore, the water level or the flow rate of the sewage 183 is allowed to be grasped with fine details. In FIG. 16, the sensor 163 is incorporated in the integrated module 160, however, for example, instead of the sensor 163, a sensor control unit that controls operation of an external sensor may be used. In this case, the sensor control unit may control a sensor that is not illustrated such as a water level gauge or a flow meter disposed in the sewage 183 and acquire information detected by the sensor. The information detected by the sensor may be transmitted to the sensor control unit wirelessly.

Specifically, the water level or the flow rate of the sewer 183 is detected by the sensor 163 once a day or once an hour, and the data detected by the sensor 163 is collected into the server 175 of the data center 184 through a high-speed communication line. The water level or the flow rate data of the sewage 183 detected by the sensor 163 may be transmitted at the same time as the measurement or may be transmitted after data for one day or one week has been accumulated to reduce the power consumption. Similar to the first application example, the vehicle for measurement may collect the data.

Since rainwater typically flows into the sewer 183, prediction of the water level or the flow rate of the sewer 183 strongly interlocks with rainfall data. Therefore, the data of the water level or the flow rate of the sewer 183 collected by the sensor 163 and the rainfall data of the Meteorological Agency are combined and analyzed, and therefore, for example, flood prediction and warning information/alarm information of a river into which water of the sewer 183 flows, may be provided.

A relationship between a weather phenomenon and the water level or the flow rate of the sewer 183 is also established from the analysis result of the data of the water level or the flow rate of the sewer 183 and the rainfall data of the Meteorological Agency. In addition, the water level or the flow rate of the sewage 183 in various places may be estimated from the rainfall data of the Meteorological Agency, and the provision and distribution of the prediction data may be changed. The water level and the flow rate of the sewer 183 change year by year depending on a housing construction, a living condition, or a land development situation, and therefore, the information processing system 170 that is allowed to continuously update data is useful.

In addition, in the second application example, the information processing system 170 may also be used for measuring the water level or the flow rate of the sewer 183 in the event of locally-concentrated heavy rain or the like. In the event of locally-concentrated heavy rain in a city area, it is desirable to measure the water level or the flow rate of the sewer 183 and to transmit information in units of minutes to secure the safety of operators of the sewer 183 and avoiding flooding of the sewer 183. In this case, it is sufficient to collect data only from the integrated modules 160 installed in a small number of manholes 176 with a relatively high altitude.

It is preferable to sufficiently store electric power in advance in the power storage module 162 of the integrated module 160 that measures the water level. The controller 164 sequentially transmits the data to the server 175 through the communication circuit 166 and the high-speed communication line. The server 175 may cause smartphones or tablets of a worker and a resident in the vicinity of a flood site to issue an alarm. Alternatively, the vehicle for measurement may be parked on a specific manhole 176 to collect data by the server installed in the vehicle through a near field communication.

Third Application Example

Figure 17:
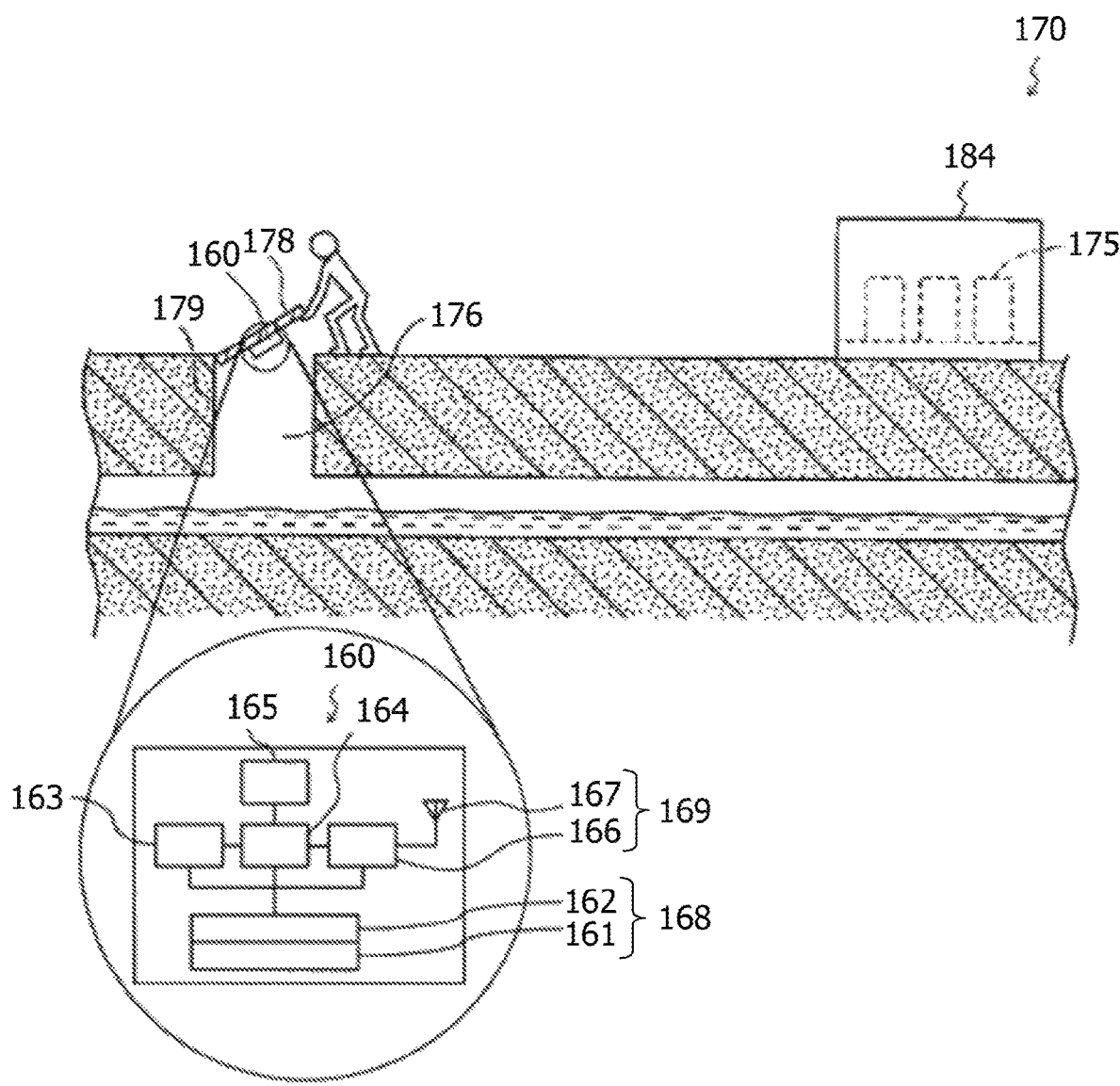
FIG. 17 is a schematic diagram illustrating a third application example of the sensor module and the information processing system according to the second embodiment.

In a third application example, as illustrated in FIG. 17, the information processing system 170 is used for security and work history of the manhole 176.

The sensor 163 detects opening/closing of the lid 178 of the manhole 176. As the sensor 163, for example, an acceleration sensor or an opening/closing switch is used. It is sufficient that the sensor 163 detects at least one of the acceleration generated in the lid 178 of the manhole 176 and the opening/closing state of the lid 178 of the manhole 176 on order to detect the opening/closing of the lid 178 of the manhole 176. Data (signal) output from the sensor 163 in response to the opening/closing of the lid 178 of the manhole 176 is received at the server 175.

In the information processing system 170, security measurements (for example, measurement for terrorism through explosion devices) of the sewer 183 are taken, and operation history in a cleaning work of the sewer 183 is checked.

Fourth Application Example

Figure 18:
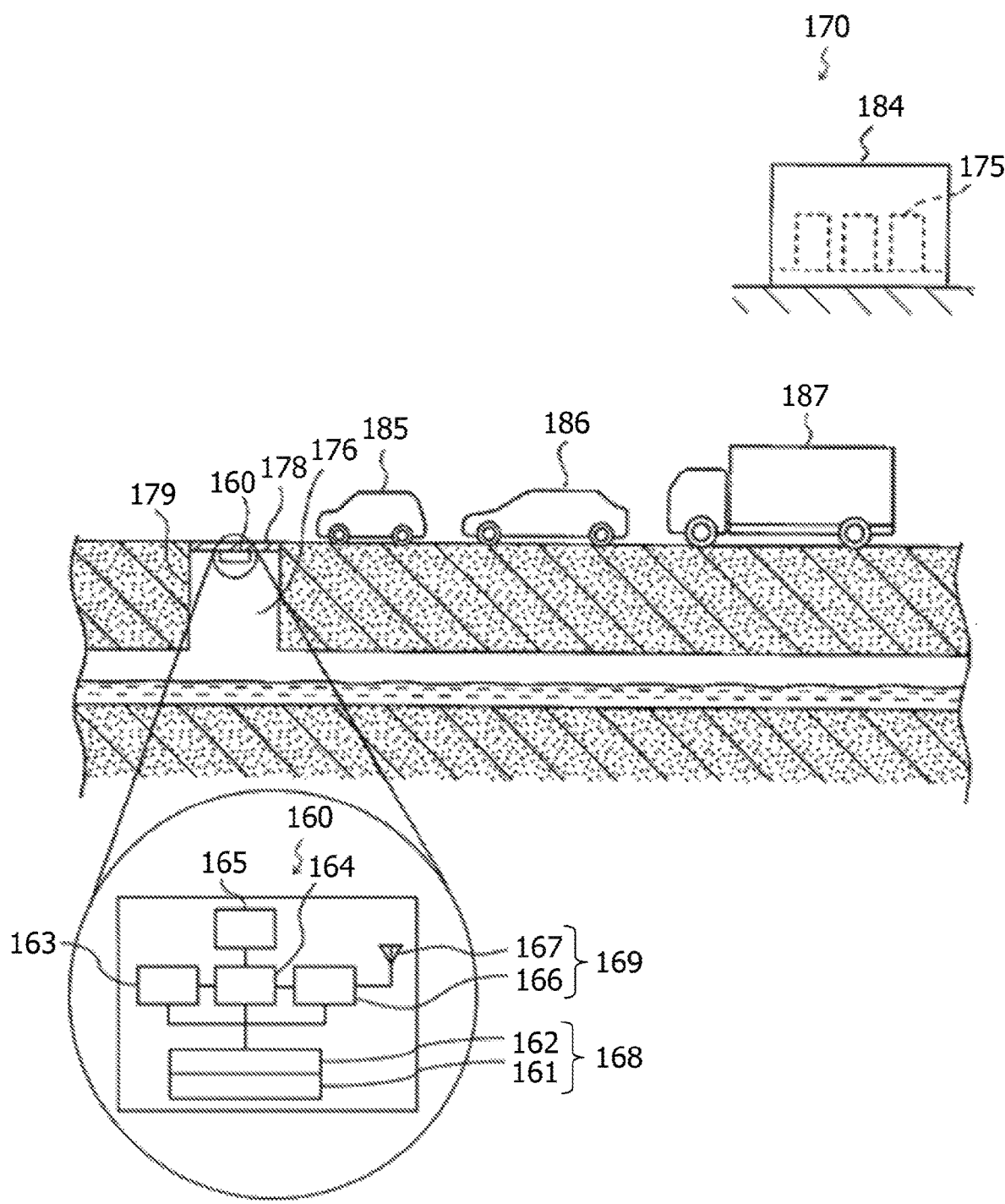
FIG. 18 is a schematic diagram illustrating a fourth application example of the sensor module and the information processing system according to the second embodiment.

In a fourth application example, as illustrated in FIG. 18, the information processing system 170 is used for acquiring road traffic information.

The sensor 163 detects vehicles 185, 186, and 187 that pass over the manhole 176. As this sensor 163, for example, an acceleration sensor, a magnetic sensor, a microphone, or the like is used. Signal corresponding to the number of vehicles that pass over the manhole 176 are obtained from the sensor 163. The data (signal) output from the sensor 163 is received at the server 175.

In the information processing system 170, congestion information even on narrow roads, alleys, or the like, which is not measured in the current road traffic information communication system may be obtained. Therefore, detailed congestion information may be provided.

In addition, the type of the vehicle 185, 186, or 187 that pass over the manhole 176 (for example, a compact car, an ordinary car, a truck, or the like) may be detected from the strength of a detected value of the sensor 163. In this case, it is sufficient that a data set obtained by associating a detected value of the sensor 163 with the type of a vehicle is stored in the memory 165 in advance. In addition, it is sufficient that the controller 164 determines the type of the vehicle from the detected value of the sensor 163 and the above-described data set and transmits the vehicle type information to the server 175. As a result, the type of vehicle that passes over the manhole 176 is grasped.

In addition, individual identification information of the vehicle 185, 186, or 187 that pass over the manhole 176 may be detected by the sensor 163. For example, when a magnetic sensor is used as the sensor 163, a characteristic of the vehicle may be obtained by a reaction of the magnetic sensor. That is, for example, a medium that emits certain magnetic specific to a car is installed in each vehicle, and therefore, the vehicle may be identified. Analysis of a difference of the movement of a car in a city based on the type of the car leads to city evaluation and urban road control such as planning to guide a specific vehicle to a specific road.

In the fourth application example, it is sufficient that the sensor 163 detects at least one of the number of vehicles that pass over the manhole 176, types of the vehicles, and individual identification information.

Fifth Application Example

Figure 19:
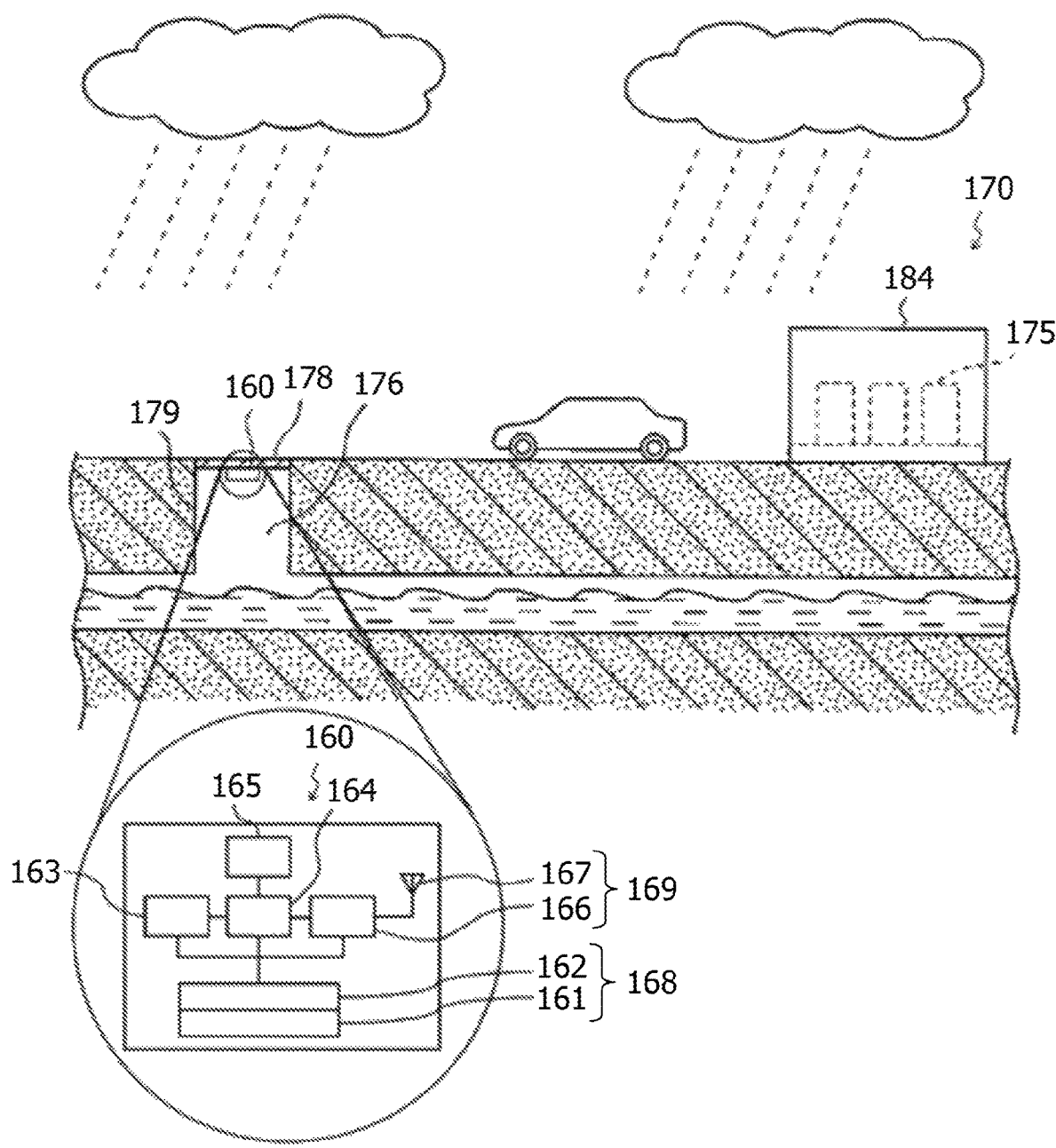
FIG. 19 is a schematic diagram illustrating a fifth application example of the sensor module and the information processing system according to the second embodiment.

In a fifth application example, as illustrated in FIG. 19, the information processing system 170 is used for measuring rainfall.

As the sensor 163, for example, an X band radar for weather prediction is used. Radio waves of the X band radar do not reach a heavy rain area, for example, in the event of heavy rain and does not get across a large object such as a mountain. Also, it may be difficult for the current radar to find and track a heavy rain area where the sudden occurrence or sudden development of the heavy rain appears. High temporal and spatial resolution are desired for the high accuracy prediction.

Typically, the resolution of the X band radar is 250 m, however, when the sensors 163 are installed in the manholes 176 at average intervals of over 30 m, it is conceivable that far more detailed meteorological observation is performed, thereby being useful for measurement and prediction of locally-concentrated heavy rain or the like. Data (signal) output from the sensor 163 is received at the server 175.

In the above-described first to fifth application examples, the dedicated server 175 is used, however, a general-purpose computer may be used as the server 175. A program that causes the general-purpose computer that functions as the server 175 to execute operations performed by the controller 164 and the server 175 may be installed and executed. In this case, the program may be supplied through a recording medium or may be downloaded from a network.

[Others]

The technology discussed herein is not limited to the configuration described in the above embodiments and modifications, and various modifications may be made without departing from the spirit of the technology discussed herein, and may also be combined appropriately.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A thermoelectric conversion module comprising:
    a thermoelectric conversion element;
    a container;
    a heat storage material accommodated in the container; and
    a first heat transfer member thermally coupled to one side of the thermoelectric conversion element and thermally coupled to the heat storage material, the first heat transfer member including a portion made of a solid-solid phase transition system heat storage material, the solid-solid phase transition system heat storage material having a thermal conductivity higher than a thermal conductivity of the heat storage material and having a transition temperature lower than a transition temperature of the heat storage material,
    a heat insulation member disposed between the heat storage material and the first heat transfer member to suppress a direct transfer of thermal energy from the first heat transfer member to a part of the heat storage material close to the first heat transfer member; and
    a fin passed through the heat insulation member to thermally couple between the first heat transfer member and the heat storage material not via the heat insulation member, the heat insulation member having one or more of portions penetrated by the fin.

2. The thermoelectric conversion module according to claim 1, wherein
    the first heat transfer member includes a base part thermally coupled to the one side of the thermoelectric conversion element and a fin thermally coupled to the heat storage material, and
    each of the base part and the fin is made of the solid-solid phase transition system heat storage material.

3. The thermoelectric conversion module according to claim 1, wherein
    the first heat transfer member includes a base part thermally coupled to the one side of the thermoelectric conversion element and a fin thermally coupled to the heat storage material,
    the base part is made of the solid-solid phase transition system heat storage material, and
    the fin is made of a material different from the solid-solid phase transition system heat storage material.

4. The thermoelectric conversion module according to claim 1, wherein
    the first heat transfer member includes a base part thermally coupled to the one side of the thermoelectric conversion element and a fin thermally coupled to the heat storage material,
    the fin is made of the solid-solid phase transition system heat storage material, and
    the base part is made of a material different from the solid-solid phase transition system heat storage material.

5. The thermoelectric conversion module according to claim 1, wherein
    the whole first heat transfer member is made of the solid-solid phase transition system heat storage material.

6. The thermoelectric conversion module according to claim 5, further comprising:
    the fin that penetrates the heat insulation member, thermally couples the heat storage material and the first heat transfer member, and is made of a material different from the solid-solid phase transition system heat storage material.

7. The thermoelectric conversion module according to claim 1, further comprising
    a second heat transfer member that is accommodated in the container and has a thermal conductivity higher than a thermal conductivity of the container, wherein
    the thermoelectric conversion element is accommodated in the container, and
    a side opposite to the one side of the thermoelectric conversion element is thermally coupled to the second heat transfer member.

8. The thermoelectric conversion module according to claim 1, further comprising
    a second heat transfer member disposed outside the container, wherein
    the thermoelectric conversion element is disposed outside the container, and
    the side opposite to the one side of the thermoelectric conversion element is thermally coupled to the second heat transfer member.

9. The thermoelectric conversion module according to claim 1, further comprising:
    a second heat transfer member disposed outside the container; and
    a third heat transfer member that is accommodated in the container and that has a thermal conductivity higher than a thermal conductivity of the container, wherein
    the thermoelectric conversion element is disposed outside the container,
    the one side of the thermoelectric conversion element is thermally coupled to the first heat transfer member through the third heat transfer member, and
    the side opposite to the one side of the thermoelectric conversion element is thermally coupled to the second heat transfer member.

10. The thermoelectric conversion module according to claim 1, further comprising
    a substrate that includes an opening and on which an electronic component is mounted, wherein
    the thermoelectric conversion element is disposed in the opening of the substrate and is electrically coupled to the substrate.

11. The thermoelectric conversion module according to claim 9, further comprising
    a substrate that includes an opening and on which an electronic component is mounted, wherein the third heat transfer member is disposed in the opening of the substrate, and the thermoelectric conversion element is electrically coupled to the substrate.

12. A sensor module comprising:

a sensor; and a thermoelectric conversion module electrically coupled to the sensor, the thermoelectric conversion module includes a thermoelectric conversion element, a container, a heat storage material accommodated in the container, and a first heat transfer member thermally coupled to one side of the thermoelectric conversion element and thermally coupled to the heat storage material, the first heat transfer member including a portion made of a solid-solid phase transition system heat storage material, the solid-solid phase transition system heat storage material having a thermal conductivity higher than a thermal conductivity of the heat storage material and having a transition temperature lower than a transition temperature of the heat storage material, a heat insulation member disposed between the heat storage material and the first heat transfer member to suppress a direct transfer of thermal energy from the first heat transfer member to a part of the heat storage material close to the first heat transfer member, and a fin passed through the heat insulation member to thermally couple between the first heat transfer member and the heat storage material not via the heat insulation member, the heat insulation member having one or more of portions penetrated by the fin.

13. An information processing system comprising:

a sensor module that includes a sensor and a thermoelectric conversion module electrically coupled to the sensor; and a computer that processes data obtained by the sensor module, wherein the thermoelectric conversion module includes a thermoelectric conversion element, a container, a heat storage material accommodated in the container, and a first heat transfer member thermally coupled to one side of the thermoelectric conversion element and thermally coupled to the heat storage material, the first heat transfer member including a portion made of a solid-solid phase transition system heat storage material, the solid-solid phase transition system heat storage material having a thermal conductivity higher than a thermal conductivity of the heat storage material and having a transition temperature lower than a transition temperature of the heat storage material, a heat insulation member disposed between the heat storage material and the first heat transfer member to suppress a direct transfer of thermal energy from the first heat transfer member to a part of the heat storage material close to the first heat transfer member, and a fin passed through the heat insulation member to thermally couple between the first heat transfer member and the heat storage material not via the heat insulation member, the heat insulation member having one or more of portions penetrated by the fin.

* * * * *